US010755752B2

(12) United States Patent
Takizawa

(10) Patent No.: US 10,755,752 B2
(45) Date of Patent: Aug. 25, 2020

(54) MEMORY DEVICE THAT PERFORMS A READ OPERATION AND A TEST OPERATION

(71) Applicant: Toshiba Memory Corporation, Tokyo (JP)

(72) Inventor: Ryousuke Takizawa, Naka Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/283,655

(22) Filed: Feb. 22, 2019

(65) Prior Publication Data

US 2020/0020365 A1  Jan. 16, 2020

(30) Foreign Application Priority Data

Jul. 11, 2018 (JP) .................................. 2018-131553

(51) Int. Cl.
*G11C 7/08* (2006.01)
*G11C 11/16* (2006.01)

(52) U.S. Cl.
CPC .............. *G11C 7/08* (2013.01); *G11C 11/161* (2013.01); *G11C 11/1655* (2013.01); *G11C 11/1657* (2013.01); *G11C 11/1673* (2013.01); *G11C 11/1675* (2013.01); *G11C 11/1693* (2013.01); *G11C 11/1697* (2013.01)

(58) Field of Classification Search
CPC ..... G11C 7/08; G11C 11/161; G11C 11/1655; G11C 11/1697; G11C 11/1673; G11C 11/1675; G11C 11/1693; G11C 11/1657
See application file for complete search history.

(56) References Cited

U.S. PATENT DOCUMENTS 9,140,747 B2 * 9/2015 Kim .................... G01R 31/2851
9,697,880 B2    7/2017 Andre et al.

* cited by examiner

*Primary Examiner* — David Lam
(74) *Attorney, Agent, or Firm* — Kim & Stewart LLP

(57) ABSTRACT

A memory device includes a first sense amplifier, and a second sense amplifier. During a read operation, a first signal based on a first output of the first sense amplifier corresponding to data stored in a memory cell before writing reference data therein and a second signal based on a second output of the first sense amplifier corresponding to data stored in the memory cell after writing reference data therein, are supplied to the second sense amplifier, which compares the first and second signals to output a comparison result representative of the data stored in the memory cell. During a test operation, a third signal based on the first output and a fourth signal based on an output from a voltage supply circuit are supplied to the second sense amplifier, which outputs a comparison result of the third and fourth signals as a test result.

20 Claims, 19 Drawing Sheets

MEMORY DEVICE THAT PERFORMS A READ OPERATION AND A TEST OPERATION

CROSS-REFERENCE TO RELATED APPLICATION

This application is based upon and claims the benefit of priority from Japanese Patent Application No. 2018-131553, filed Jul. 11, 2018, the entire contents of which are incorporated herein by reference.

FIELD

Embodiments described herein relate generally to a memory device.

BACKGROUND

In recent years, research and development has been carried out on memory devices that store data by associating the data with the resistance state of a memory element. Such memory devices include MRAM, ReRAM, and PCRAM, which are all variable resistance memory devices.

DETAILED DESCRIPTION

In general, according to one embodiment, a memory device includes a memory cell, a first sense amplifier circuit that is electrically connected to the memory cell, a second sense amplifier circuit that is electrically connected to the first sense amplifier circuit through a selection circuit, and a voltage supply circuit that is electrically connected to the second sense amplifier circuit through the selection circuit and includes a first terminal. At a time of performing a read operation on the memory cell, a first signal based on a first output signal of the first sense amplifier circuit corresponding to data stored in the memory cell before writing of reference data therein and a second signal based on a second output signal of the first sense amplifier circuit corresponding to data stored in the memory cell after writing of the reference data therein, are supplied to the second sense amplifier circuit, and the second sense amplifier circuit compares the first and second signals and outputs a comparison result that is representative of the data stored in the memory cell before writing of the reference data therein. At a time of performing a test operation on the memory cell, a third signal based on the first output signal and a fourth signal based on a first voltage applied to the first terminal are supplied to the second sense amplifier circuit, and the second sense amplifier circuit outputs a comparison result of the third and fourth signals as a test result.

EMBODIMENTS

Hereinafter, the present embodiment will be described in detail with reference to FIG. 1 to FIG. 20. In the following description, elements having the same function and the same configuration will be designated by the same reference signs. In addition, in the following embodiment, when components (for example, word lines WL and bit lines BL, various voltages and signals, and the like), of which the reference signs have a number/alphabet suffix for distinction, are not distinguished from each other, the components will be referred to without the number/alphabet suffix.

(1) First Embodiment

A memory device of a first embodiment will be described with reference to FIG. 1 to FIG. 13.

(a) Configuration

A configuration example of the memory device of the embodiment will be described with reference to FIGS. 1 to 4.

Figure 1:
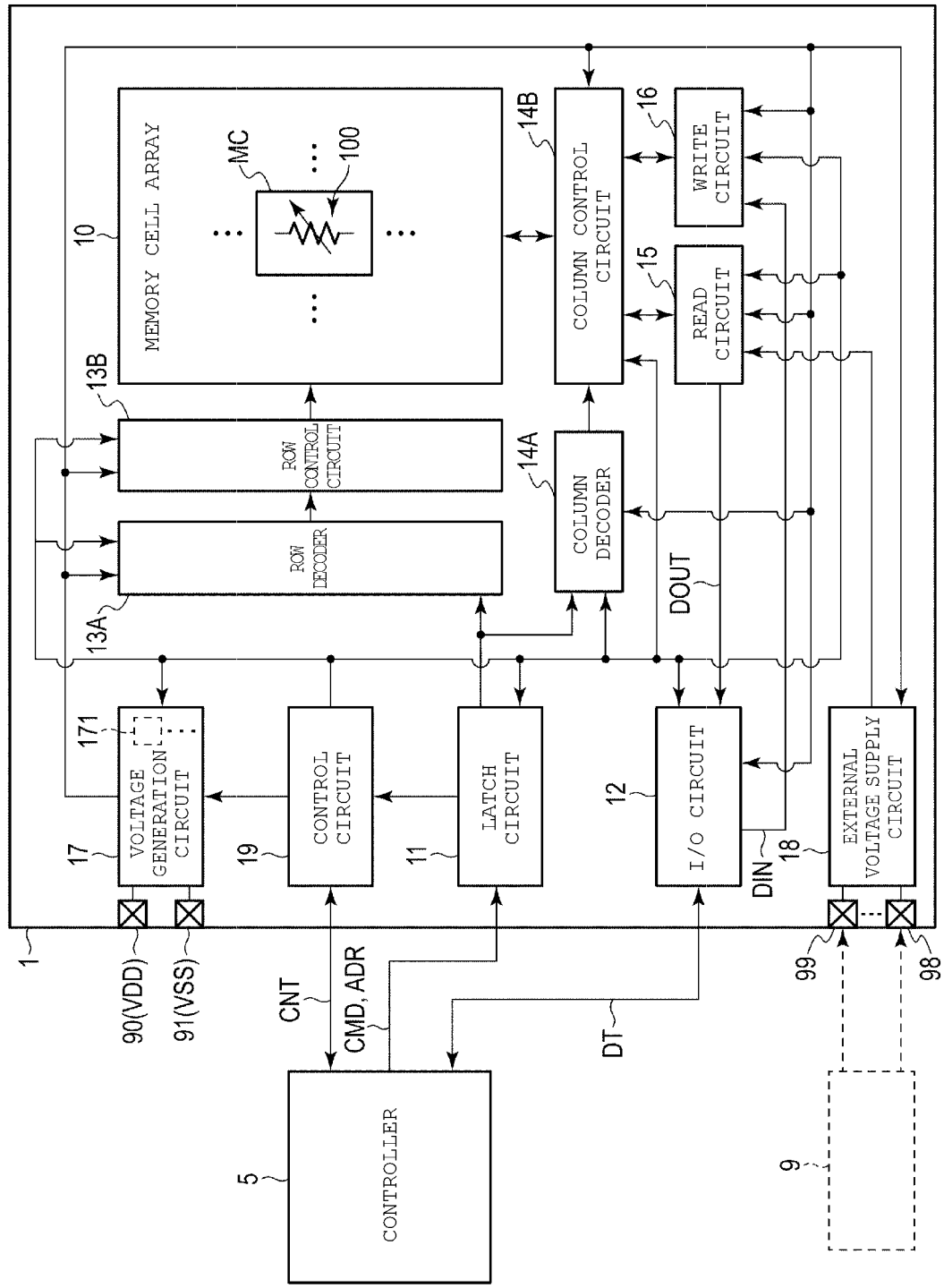
FIG. 1 is a diagram illustrating a configuration example of a memory device of a first embodiment.

FIG. 1 is a block diagram for describing a configuration example of the memory device of the first embodiment.

As illustrated in FIG. 1, a memory device (for example, a variable resistance memory such as a magnetic memory) 1 is directly or indirectly connected to a controller (or a processor) 5. The memory device 1 and the controller 5 form a memory system.

The controller 5 controls the operation of the memory device 1. The controller 5 includes a CPU, a buffer memory, a working memory, an ECC circuit, and the like. The controller 5 generates a command based on a request from a host device (not illustrated). The controller 5 transmits the generated command to the memory device 1. The controller 5 transmits the address of a memory cell to be selected to the memory device 1 based on a management table. At the time of writing data into the memory device 1, the controller 5 transmits data DT to the memory device 1. At the time of reading data from the memory device 1, the controller 5 receives the data DT that is read from the memory device 1. The controller 5 transmits the read data to the host device.

The memory device 1 is a memory chip, a memory package, or a memory module. The memory device 1 includes at least a memory cell array 10, a latch circuit 11, an input-output circuit 12, a row decoder 13A, a row control circuit 13B, a column decoder 14A, a column control circuit 14B, a read circuit 15, a write circuit 16, a voltage generation circuit 17, an external voltage supply circuit 18, and a control circuit 19.

The memory cell array 10 includes a plurality of memory cells MC.

When the memory device 1 is a variable resistance memory, the memory cell MC includes at least one variable resistance element 100. The variable resistance memory 1 stores data of one bit or more in one memory cell MC by associating the data to be stored with a plurality of resistance values (resistance states) that the variable resistance element 100 may have.

The latch circuit 11 temporarily holds a command CMD and an address ADR that are transmitted from the controller 5. The latch circuit 11 transmits the command CMD to the control circuit 19. The latch circuit 11 transmits the address ADR to the row decoder 13A and the column decoder 14A.

The input-output circuit (I/O circuit) 12 temporarily holds data (write data) DIN that is transmitted from the controller 5. The input-output circuit 12 temporarily holds data DOUT that is read from the memory cell array 10.

The row decoder 13A decodes a row address that is included in the address ADR.

The row control circuit 13B selects a row (for example, a word line) of the memory cell array 10 based on the decoding result of the row address.

The column decoder 14A decodes a column address that is included in the address ADR.

The column control circuit 14B selects a column (for example, a bit line) of the memory cell array 10 based on the decoding result of the column address.

At the time of a read operation, the read circuit 15 supplies various voltages or currents for reading data to a memory cell that is selected based on the address ADR. Accordingly, data that is stored in the memory cell is read. The read circuit 15 includes at least a read driver/sinker and a sense amplifier circuit.

At the time of a write operation, the write circuit 16 supplies various voltages and currents for writing data to the memory cell selected based on the address ADR. Accordingly, the data to be written is written into the memory cell MC. The write circuit 16 includes at least a write driver/sinker.

The voltage generation circuit 17 generates various voltages used in the operation of the memory device 1 using a voltage that is supplied from the outside of the memory device 1. The voltage generation circuit 17 supplies the generated voltages to each of the circuits 11 to 16. For example, the voltage generation circuit 17 includes an offset voltage generation circuit 171. The offset voltage generation circuit 171 generates and outputs a voltage for generating an offset value at the time of the read operation and/or the write operation. The voltage generation circuit 17 is connected to external connection terminals (pins, pads, or connectors) 90 and 91 that are disposed in the chip/package. A power supply voltage VDD is applied to the terminal 90. A ground voltage VSS is applied to the terminal 91. For example, the voltages VDD and VSS are supplied from the controller 5, the host device, or a motherboard.

The control circuit 19 receives a control signal CNT from the controller 5. The control circuit 19 transmits the control signal CNT to the controller 5 depending on the operating status in the memory device 1. The control circuit 19 receives the command CMD from the controller 5 through the latch circuit 11. The control circuit 19 controls the operation of each of the circuits 11 to 18 in the memory device 1 based on the command CMD and the control signal CNT. For example, the control circuit 19 holds information related to voltages and currents used in the write operation, the read operation, and the like as setting information.

The memory device 1 of the present embodiment includes the external voltage supply circuit 18. The external voltage supply circuit (hereinafter, referred to as a test voltage generation circuit) 18 can supply an external voltage for use in a test operation/check operation (for example, screening) at the time of the shipment, return, and the like of the memory device 1 to other circuits in the memory device 1.

In the test operation/check operation at the time of the shipment and return of the memory device 1, a predetermined voltage is provided to the external voltage supply circuit 18 from the outside of the memory device 1.

At the time of the test operation/check operation for the memory device 1, the external voltage supply circuit 18 generates various voltages (test voltages) for the test operation/check operation using the voltage provided from the outside. The external voltage supply circuit 18 can supply the generated voltages to the read circuit 15.

In the memory device 1 of the present embodiment, the read circuit 15 executes the test operation and the check operation using the voltages from the external voltage supply circuit 18. For example, the voltages for the test operation/check operation are applied to external connection terminals (for example, a pin, a pad, or a connector) 98, 99 from the controller 5, a test device 9 (e.g., a test circuit), the motherboard, or the host device (not illustrated). The external connection terminals (external voltage terminal) 98, 99 are connected to the external voltage supply circuit 18.

An ECC circuit may be disposed in the memory device 1.

The configuration of the system including the memory device 1 is not limited to the example illustrated in FIG. 1. The memory device 1 of the present embodiment may be used for various systems. For example, the controller 5 may not be disposed for the memory device 1. In this case, a command and the like are transmitted to the memory device 1 from the host device (for example, a CPU). The memory device 1 may be disposed in the host device or the CPU of the host device. The memory device 1 may be used for the working memory, the buffer memory, or a cache memory in the controller 5 (or the CPU).

Figure 2:
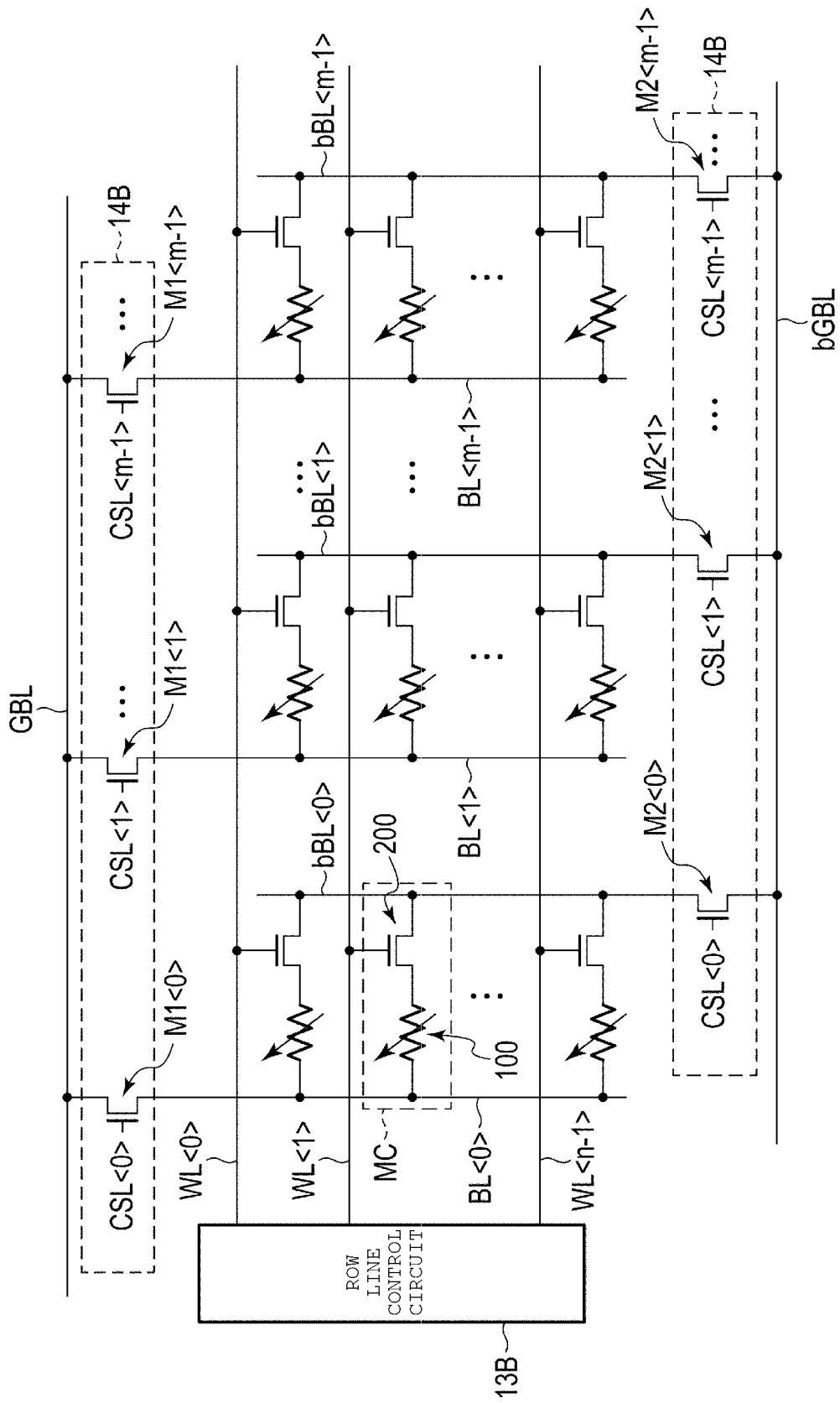
FIG. 2 is a diagram illustrating a configuration example of a memory cell array of the memory device of the first embodiment.

Internal Configuration of Memory Cell Array FIG. 2 is a diagram illustrating one example of an internal configuration of the memory cell array of the memory device (variable resistance memory) of the embodiment.

As illustrated in FIG. 2, a plurality (n) of word lines WL (WL<0>, WL<1>, WL<n−1>) are disposed in the memory cell array 10. A plurality (m) of bit lines BL (BL<0>, BL<1>, . . . , BL<m−1>) and a plurality (m) of bit lines bBL (bBL<0>, bBL<1>, bBL<m−1>) are disposed in the memory cell array 10. One bit line BL and one bit line bBL form a bit line pair.

The plurality of memory cells MC are arranged in a matrix form in the memory cell array 10.

A plurality of memory cells MC arranged in an x direction (also referred to as row direction) are connected to the common word line WL. The word line WL is connected to the row control circuit 13B. The row control circuit 13B controls the electric potential of the word line WL based on the row address. Accordingly, the word line WL that is indicated in the row address is selected and activated.

A plurality of memory cells MC arranged in a y direction (also referred to as column direction) are connected in common to two bit lines BL and bBL that belong to one bit line pair.

In FIG. 2, for example, the memory cell array 10 has a structure based on a hierarchical bit line method. In this case, global bit lines GBL and bGBL are disposed in the memory cell array 10. The global bit line GBL is connected to the bit lines BL through switches M1 (M1<0>, M1<1>, . . . , M1<m-1>). The global bit line bGBL is connected to the bit lines bBL through switches M2 (M2<0>, M2<1>, . . . , M2<m-1>). Hereinafter, the bit lines BL and bBL will be referred to as local bit lines BL and bBL for distinction.

The switches M1 and M2 are, for example, N-type field effect transistors (or MOS switches). The switches M1 and M2 may be regarded as components of the column control circuit 14B. The gate of each of the switches M1 and M2 is supplied with a corresponding control signal CSL (CSL<0>, CSL<1>, CSL<m-1>) as a column selection signal. When the switches M1 and M2 are set to be in an ON state, the bit lines BL and bBL are electrically connected to the global bit lines GBL and bGBL. Accordingly, the bit lines BL and bBL that are indicated in the column address are selected and activated.

Hereinafter, a memory cell that is selected as an operation target memory cell based on the address ADR from the outside will be referred to as a selected cell.

For example, the read circuit (including the sense amplifier circuit, the driver/sinker, and the like) 15 and the write circuit (including the driver/sinker and the like) 16 are connected to the global bit lines GBL and bGBL. The read circuit 15 and the write circuit 16 may be connected to the local bit lines BL and bBL. A switch for setting the local bit lines BL and bBL and the global bit lines GBL and bGBL to be in a discharging state or a charging state may be disposed in the local bit lines BL and bBL and the global bit lines GBL and bGBL.

The memory cell MC includes one variable resistance element 100 and one cell transistor 200. The variable resistance element 100 functions as a memory element. The cell transistor 200 functions as a selection element of the memory cell MC.

One end of the variable resistance element 100 is connected to the bit line BL. The other end of the variable resistance element 100 is connected to one end (one of the source/drain) of the cell transistor 200. The other end (the other of the source/drain) of the cell transistor 200 is connected to the bit line bBL.

Data of one bit or more is stored in the memory cell MC by associating the resistance state (corresponding to its resistance value) of the variable resistance element 100 with the data.

The configuration of the memory cell array 10 is not limited to the example in FIG. 2. For example, the memory cell array 10 may be a cross-point type memory cell array.

For example, the memory device of the present embodiment is an MRAM (magnetic random access memory). In the MRAM, a magnetoresistive effect element is used in the variable resistance element 100 as a memory element.

Magnetoresistive Effect Element

The structure and the function of the magnetoresistive effect element as a memory element will be described with reference to FIGS. 3 and 4.

Figure 3:
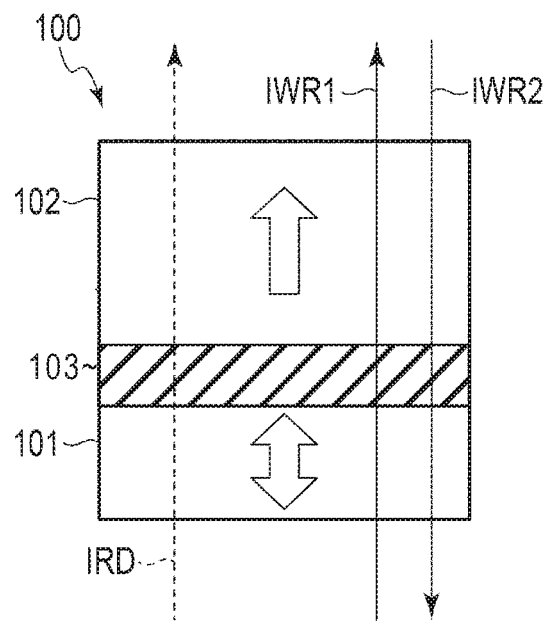
FIG. 3 is a diagram illustrating a structure of a memory element of the memory device of the first embodiment.

FIG. 3 illustrates one example of a basic structure of the magnetoresistive effect element.

As illustrated in FIG. 3, the magnetoresistive effect element 100 includes at least two magnetic layers 101 and 102 and a non-magnetic layer 103.

Each of the two magnetic layers 101 and 102 has magnetization. The direction of magnetization of the magnetic layer 101 is variable. The direction of magnetization of the magnetic layer 102 is invariable (i.e., in a fixed state). In the present embodiment, the magnetic layer 101 of which the direction of magnetization is variable is referred to as the storage layer 101, and the magnetic layer 102 of which the direction of magnetization is invariable is referred to as the reference layer 102. In the present embodiment, the "direction of magnetization of the reference layer is invariable" or the "direction of magnetization of the reference layer is in a fixed state" means that when a current or a voltage for changing the direction of magnetization of the storage layer is supplied to the magnetoresistive effect element, the direction of magnetization of the reference layer does not change before and after the supply of the current/voltage.

The non-magnetic layer 103 is disposed between the two magnetic layers 101 and 102. The non-magnetic layer 103 functions as the tunnel barrier layer 103. For example, the tunnel barrier layer 103 is an insulation layer that includes magnesium oxide.

For example, the two magnetic layers 101 and 102 and the tunnel barrier layer 103 form a magnetic tunnel junction (MTJ for short). In the present embodiment, the magnetoresistive effect element 100 having the magnetic tunnel junction is referred to as the MTJ element 100.

For example, the magnetic layers 101 and 102 have perpendicular magnetic anisotropy. The magnetization directions (also referred to as magnetization easy axis directions) of the magnetic layers 101 and 102 are substantially perpendicular to the layer surfaces of the magnetic layers. The magnetization directions of the magnetic layers 101 and 102 are substantially parallel to the stack direction of the plurality of layers 101, 102, and 103. The perpendicular magnetic anisotropy of the magnetic layers 101 and 102 occurs based on the interface magnetic anisotropy of the magnetic layers. The MTJ element that uses the perpendicular magnetic anisotropy of the magnetic layers is referred to as a perpendicular magnetization type MTJ element.

The resistance state of the MTJ element (more generally, magnetoresistive effect element) 100 changes depending on the relative relationship (in particular, magnetization arrangement) between the direction of magnetization of the storage layer 101 and the direction of magnetization of the reference layer 102. When the direction of magnetization of the storage layer 101 is the same as the direction of magnetization of the reference layer 102, the MTJ element 100 has a first resistance state (or first magnetization arrangement state). When the direction of magnetization of the storage layer 101 is opposite to the direction of magnetization of the reference layer 102, the MTJ element 100 has a second resistance state (or second magnetization arrangement state). The resistance value of the MTJ element 100 having the second resistance state is higher than the resistance value of the MTJ element 100 having the first resistance state.

In such a manner, the MTJ element 100 may have any one state of a low resistance state or a high resistance state depending on the magnetization arrangement of the two magnetization layers 101 and 102.

For example, the MTJ element 100 holds data of one bit (data of "0" and data of "1"). In this case, when the resistance state of the MTJ element 100 is set to the first resistance state, the memory cell MC is set to be in a first data holding state (for example, a "0" data holding state). When the resistance state of the MTJ element 100 is set to the second resistance state, the memory cell MC is set to be in a second data holding state (for example, a "1" data holding state).

In the present embodiment, the magnetization arrangement state where the direction of magnetization of the storage layer 101 is the same as the direction of magnetization of the reference layer 102 in the MTJ element 100 is referred to as a parallel state (or a P state). The magnetization arrangement state where the direction of magnetization of the storage layer 101 is opposite to the direction of magnetization of the reference layer 102 in the MTJ element 100 is referred to as an antiparallel state (or an AP state).

For example, a spin transfer magnetization reversal method is used to control the direction of magnetization of the storage layer 101 of the MTJ element 100. The spin transfer magnetization reversal method is a write method for controlling the direction of magnetization of the storage layer 101 using a spin torque that occurs when write currents IWR1 and IWR2 flow in the MTJ element 100.

When the magnetization arrangement state of the MTJ element 100 is changed to the P state from the AP state, the write current IWR1 that flows to the reference layer 102 from the storage layer 101 is supplied to the MTJ element 100. In this case, a spin torque of an electron having a spin in the same direction as the direction of magnetization of the reference layer 102 is applied to the magnetization of the storage layer 101.

When the direction of magnetization of the storage layer 101 is opposite to the direction of magnetization of the reference layer 102, the direction of magnetization of the storage layer 101 is set to the same direction as the direction of magnetization of the reference layer 102 by the applied spin torque. Consequently, the MTJ element 100 is set to be in the P state. In such a manner, data of "0" is written into the memory cell MC. When the write current IWR1 is supplied to the MTJ element 100 in the P state, the direction of magnetization of the storage layer 101 does not change before and after the supply of the write current IWR1. Accordingly, in this case, the MTJ element 100 maintains the P state.

When the magnetization arrangement state of the MTJ element 100 is changed to the AP state from the P state, the write current IWR2 that flows to the storage layer 101 from the reference layer 102 is supplied to the MTJ element 100. In this case, a spin torque of an electron having a spin of the opposite direction to the direction of magnetization of the reference layer 102 is applied to the magnetization of the storage layer 101.

When the direction of magnetization of the storage layer 101 is the same as the direction of magnetization of the reference layer 102, the direction of magnetization of the storage layer 101 is set to the opposite direction to the direction of magnetization of the reference layer 102 by the applied spin torque. Consequently, the MTJ element 100 is set to be in the AP state. In such a manner, data of "1" is written into the memory cell MC. When the write current IWR2 is supplied to the MTJ element 100 in the AP state, the direction of magnetization of the storage layer 101 does not change before and after the supply of the write current IWR2. Accordingly, the MTJ element 100 maintains the AP state.

At the time of reading data from the MTJ element 100 (which involves determining the resistance state of the MTJ element 100), a read current IRD flows in the MTJ element 100. The current value of the read current IRD is less than a magnetization reversal threshold of the storage layer 101.

Data is read based on the current value of the read current IRD, a change in the electric potential of a certain node caused by the read current IRD, or a sensing result of the amount or the like of accumulated charges caused by the read current IRD. For example, the current value of the read current IRD that is output from the MTJ element 100 in the high resistance state (AP state) is less than the current value of the read current IRD output from the MTJ element 100 in the low resistance state (P state). Based on such a change in the current IRD accompanied by a difference in the resistance state of the MTJ element 100, data held by the memory cell MC (MTJ element 100) is determined.

In the MRAM of the present embodiment, a read operation based on a self-reference method is used for reading data from the memory cell MC.

Figure 4:
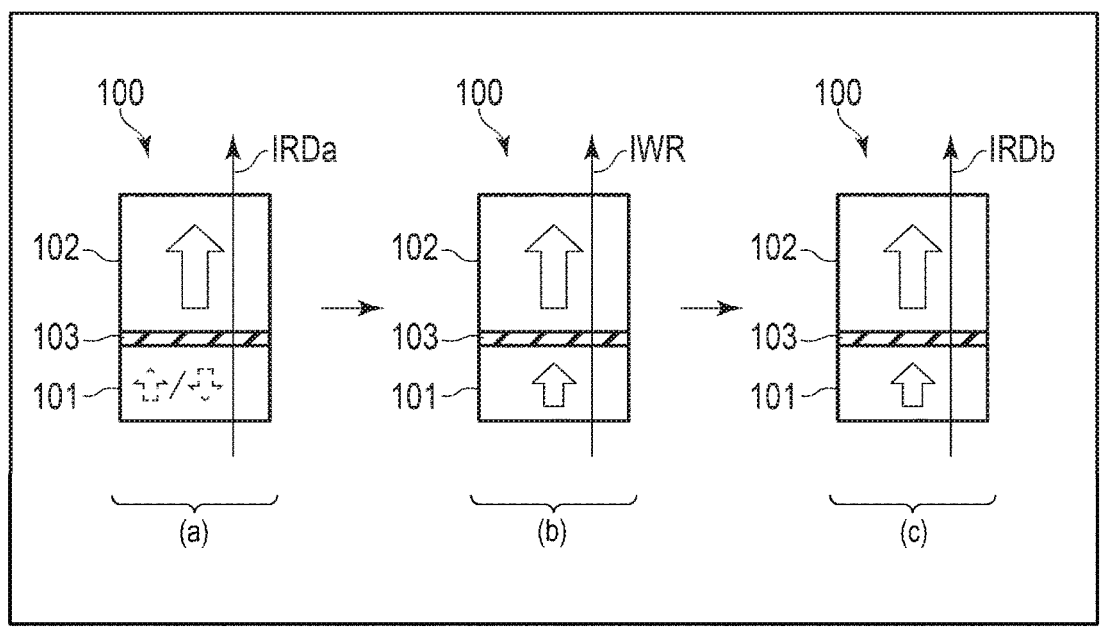
FIG. 4 is a diagram illustrating a basic concept of the operation of the memory device of the first embodiment.

FIG. 4 is a schematic diagram for illustrating a basic principle of the read operation based on the self-reference method in the MRAM of the present embodiment. In FIG. 4, a read operation based on a data destruction type self-reference method is illustrated as the read operation based on the self-reference method. As illustrated in FIG. 4, in the read operation based on the self-reference method, data reads are executed twice (and as such, the read current is supplied twice) for the selected cell MC.

In the read operation based on the self-reference method, the amount of electricity (the current value or the electric potential) caused by a read current IRDa in the first data read (part (a) of FIG. 4) for the selected cell MC is compared with the amount of electricity caused by a read current IRDb in the second data read (part (c) of FIG. 4) for the selected cell MC.

As illustrated in part (b) of FIG. 4, for example, in the read operation based on the data destruction type self-reference method, the write current IWR is supplied to the MTJ element 100 between the first data read and the second data read.

The write current IWR that is supplied at the time of the read operation based on the self-reference method is a current for writing preset data into the MTJ element 100. The preset data is data that is a reference for determining data (data before the supply of the write current IWR) stored in the MTJ element. In the present embodiment, for distinction, writing of data (which involves supply of the write current) between the first data read and the second data read in the read operation based on the self-reference method will be referred to as a reset write operation or a reference data write. For clarification of description, data stored in the memory cell before writing of the reference data is referred to as user data.

For example, after the first data read, the write current (the write current for writing data of "0") IWR for setting the magnetization arrangement state of the MTJ element to be in the P state is supplied to the MTJ element 100 of a data read target. When the magnetization arrangement state of the MTJ element 100 is in the AP state, the magnetization arrangement state of the MTJ element 100 is changed to the P state from the AP state by the supply of the write current IWR. When the magnetization arrangement state of the MTJ element 100 is in the P state, the MTJ element 100 maintains the P state even if the write current IWR is supplied.

In such a manner, the MTJ element 100 is set to be in the P state at the time of supplying the read current for the second time (part (c) of FIG. 4). At the time of supplying the read current in the first data read (part (a) of FIG. 4), the MTJ element 100 is in the AP state or the P state depending on the stored data.

The read currents IRDa and IRDb flow in the same direction as the write current IWR that flows in a direction in which the magnetization arrangement state of the MTJ element is changed to the P state from the AP state.

When the magnetization arrangement state of the MTJ element 100 is changed by the supply of the write current IWR (for writing of the reference data), the current value of the read current IRDa in the first data read is different from the current value of the read current IRDb in the second data read.

When the magnetization arrangement state of the MTJ element 100 is changed to the P state from the AP state, the current value of the second read current IRDb is greater than the current value of the read current IRDa in the first data read. Consequently, data held in the selected cell MC is determined as data of "1".

When the magnetization arrangement state of the MTJ element 100 does not change, the current value of the read current IRDb in the second data read is substantially the same as the current value of the read current IRDa in the first data read. In this case, there is almost no difference or a small difference between the current value of the read current IRDb in the second data read and the current value of the read current IRDa in the first data read. Consequently, data held in the selected cell MC is determined as data of "0".

In such a manner, the read operation based on the self-reference method is executed by comparing two output values from the selected cell at the time of supply of the currents.

An offset may be given to the read current IRDa or the read current IRDb by the read circuit in order to improve the reliability of reading of data.

Basic Configuration of Read Circuit A configuration example of the read circuit of the MRAM of the present embodiment will be described using FIG. 5 to FIG. 8.

Figure 5:
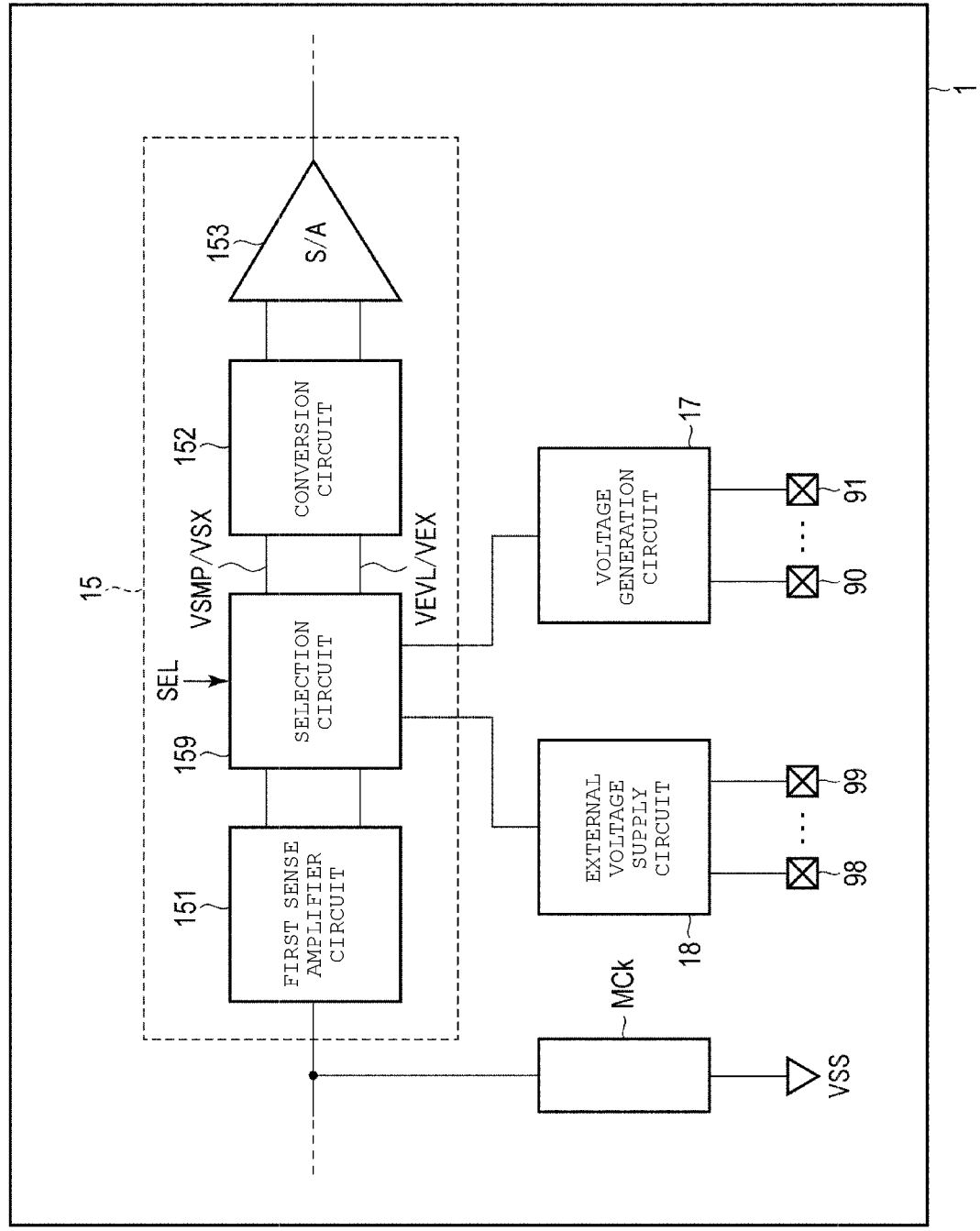
FIGS. 5-7 are diagrams illustrating a configuration example of a read circuit of the memory device of the first embodiment.

FIG. 5 is a schematic diagram for describing an overall configuration of the read circuit of the MRAM of the present embodiment. The read operation based on the self-reference method is executed by the read circuit in FIG. 5.

As illustrated in FIG. 5, in the MRAM of the present embodiment, the read circuit 15 includes a first sense amplifier circuit 151, a conversion circuit 152, and a second sense amplifier circuit 153.

The first sense amplifier circuit 151 is connected to a memory cell MCk of a data read target (referred to herein as selected cell) through the bit lines (global bit lines/local bit lines) and the column control circuit 14B.

The first sense amplifier circuit 151 senses and amplifies a cell signal (a cell signal based on the first data read) from the selected cell MCk before writing of the reference data, and a reference signal (a cell signal based on the second data read) from the selected cell MCk after writing of the reference data.

Hereinafter, for distinction of description, the first sense amplifier circuit 151 may be referred to as the preamplifier circuit 151.

The conversion circuit 152 is connected between the first sense amplifier circuit 151 and the second sense amplifier circuit 153. The conversion circuit 152 converts a signal (in particular, voltage) from the first sense amplifier circuit 151 from a voltage into a current. The conversion circuit 152 supplies the converted signal (in particular, current) to the second sense amplifier circuit 153.

The second sense amplifier circuit 153 can sense, amplify, and compare two output signals (corresponding to current values or current magnitudes) from the conversion circuit 152. By the operation of the second sense amplifier circuit 153, the magnitude relationship of the output signals of the selected cell MCk with respect to a reference value is determined. Consequently, data stored in the selected cell MCk is read.

The conversion circuit 152 may be apart of the components of the second sense amplifier circuit 153.

In the present embodiment, a selection circuit 159 is connected between the conversion circuit 152 and the first sense amplifier circuit 151. The voltage generation circuit 17 and the external voltage supply circuit 18 are connected to the selection circuit 159.

The external voltage supply circuit 18 supplies an external voltage (an external reference voltage or an external operation voltage) applied to the external connection terminal 99 to the selection circuit 159.

The selection circuit 159 controls the electrical connection of the first sense amplifier circuit 151, the voltage generation circuit 17, and the external voltage supply circuit 18 to the conversion circuit 152 based on a control signal SEL. The selection circuit 159 can supply a signal (in particular, voltage) VSMP from the first sense amplifier circuit 151 or a signal VEX from the external voltage supply circuit 18 to one terminal of the second sense amplifier circuit 153 through and after conversion by the conversion circuit 152. The selection circuit 159 can supply a signal (in particular, voltage) VEVL from the first sense amplifier circuit 151 or a signal VEX from the external voltage supply circuit 18 to the other terminal of the second sense amplifier circuit 153 through and after conversion by the conversion circuit 152. In addition, the selection circuit 159 can supply a signal (in particular, voltage) from the voltage generation circuit 17 to one and/or the other terminal of the second sense amplifier circuit 153 through and after conversion by the conversion circuit 152.

In the example in FIG. 5, the circuits 151, 152, 153, and 159 of one group that belongs to one control unit are illustrated. When a plurality of control units (for example, the units of the global bit lines GBL and bGBL) are set with respect to reading of data in the memory cell array, one or more groups of the circuits 151, 152, 153, and 159 may be disposed in the MRAM.

Configuration Example of First Sense Amplifier Circuit

A configuration example of the first sense amplifier circuit in the read circuit of the MRAM of the present embodiment will be described with reference to FIG. 6.

Figure 6:
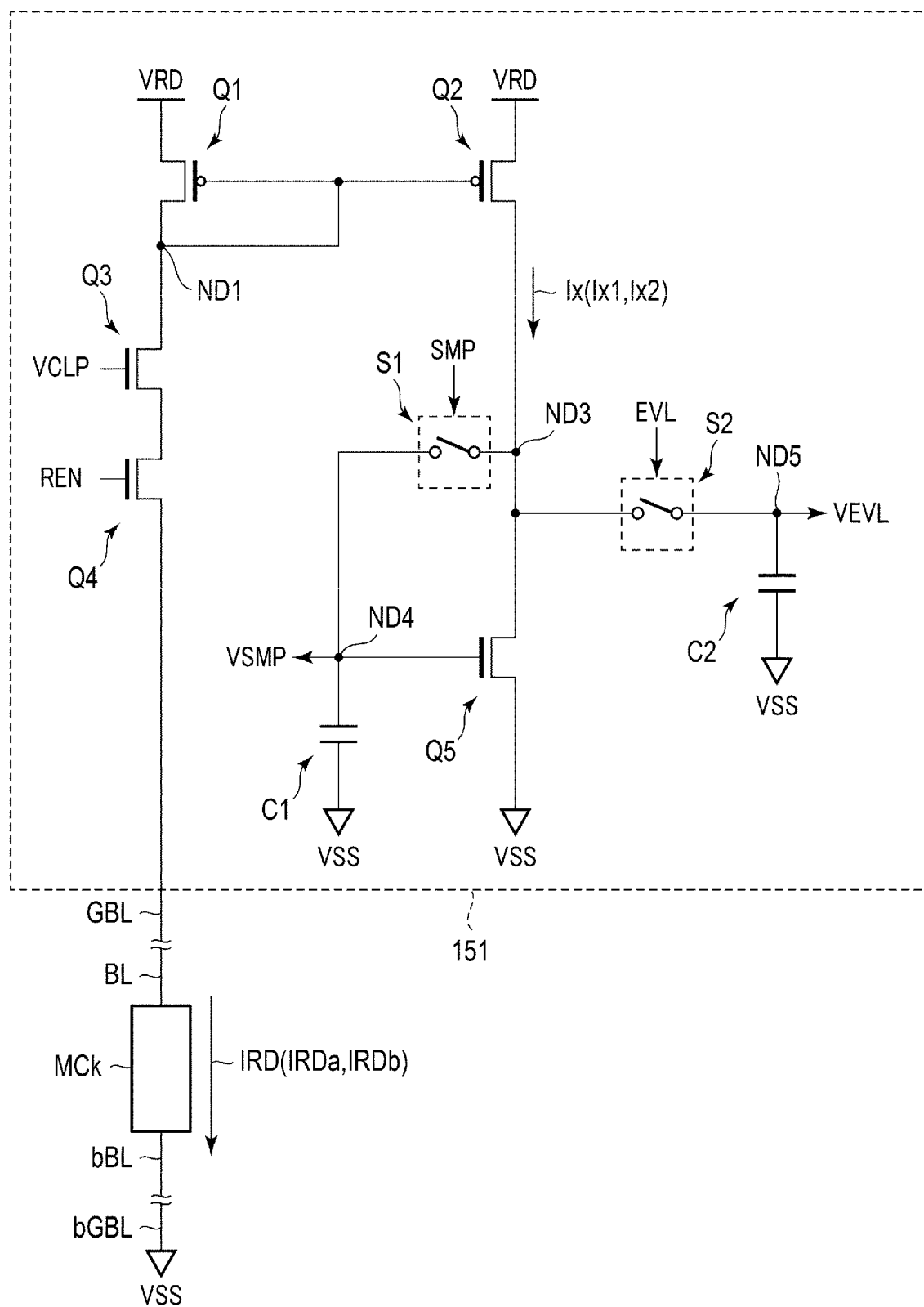

FIG. 6 is a schematic circuit diagram for describing an internal configuration of the first sense amplifier circuit (preamplifier circuit).

As illustrated in FIG. 6, the preamplifier circuit 151 includes P-type field effect transistors (for example, MOS transistors) Q1 and Q2, N-type field effect transistors Q3, Q4, and Q5, switches S1 and S2, and capacitance elements C1 and C2.

One end (one of the source/drain of a transistor) of the current path of the transistor Q1 is connected to a terminal (hereinafter, referred to as a voltage terminal VRD) to which a voltage VRD is applied, and the other end (the other of the source/drain of a transistor) of the current path of the transistor Q1 is connected to a node ND1. The gate of the transistor Q1 is connected to the node ND1.

One end of the current path of the transistor Q2 is connected to the voltage terminal VRD. The other end of the current path of the transistor Q2 is connected to a node ND3. The gate of the transistor Q2 is connected to the node ND1 and the gate of the transistor Q1.

The transistor Q1 and the transistor Q2 function as current mirrors. Hereinafter, a configuration that includes the transistors Q1 and Q2 may be referred to as a current mirror circuit.

One end of the current path of the transistor Q3 is connected to the node ND1. The other end of the current path of the transistor Q3 is connected to the bit lines (the global bit line and the local bit line) GBL and BL through the current path of the transistor Q4. A signal (in particular, clamp voltage) VCLP is supplied to the gate of the transistor Q3.

The transistor Q3 is a clamp transistor. The clamp transistor Q3 controls the amount of the current flowing in the global bit line GBL and the bit line BL (or the electric potentials of the global bit line GBL and the bit line BL) depending on the voltage value of the clamp voltage VCLP. The voltage value of the clamp voltage VCLP corresponds to the total of the electric potential of the global bit line GBL and a threshold voltage Vth of the clamp transistor Q3. Accordingly, the electric potential of the global bit line GBL (and the bit line BL) is set to approximately "VCLP−Vth".

One end of the current path of the transistor Q4 is connected to the other end of the current path of the clamp transistor Q3. The other end of the current path of the transistor Q4 is connected to the bit line (global bit line GBL). A signal REN is supplied to the gate of the transistor Q4. The signal REN is, for example, a read enable signal. The transistor Q4 electrically connects the selected cell MCk to the preamplifier circuit 151 depending on the signal level of the read enable signal REN.

One end of the current path of the transistor Q5 is connected to the node ND3. The other end of the current path of the transistor Q5 is connected to a terminal (hereinafter, referred to as a ground terminal VSS) to which the ground voltage VSS is applied. The gate of the transistor Q5 is connected to a node ND4.

One end of the current path of the switch (for example, a MOS switch) S1 is connected to the node ND3. The other end of the current path of the switch S1 is connected to the node ND4. A control signal SMP is supplied to a control terminal of the switch S1. The switch S1 controls electrical connection/isolation between the node ND3 and the node ND4 based on the control signal SMP.

One end of the current path of the switch (for example, a MOS switch) S2 is connected to the node ND3. The other end of the current path of the switch S2 is connected to a node ND5. A control signal EVL is supplied to a control terminal of the switch S2. The switch S2 controls electrical connection/isolation between the node ND3 and the node ND5 based on the control signal EVL.

One end of the capacitance element C1 is connected to the node ND4. The other end of the capacitance element C1 is connected to the ground terminal VSS. The capacitance element C1 holds a signal (in particular, electric potential) that corresponds to the output from the selected cell MCk at the time of the first data read. The electric potential (or signal charge) VSMP held by the capacitance element C1 is an electric potential that corresponds to the stored data. The electric potential VSMP of the capacitance element C1 is applied to (and thus reflected in) the node ND4.

One end of the capacitance element C2 is connected to the node ND5. The other end of the capacitance element C2 is connected to the ground terminal VSS. The capacitance element C2 holds an electric potential that corresponds to the output from the selected cell MCk at the time of the second data read. The electric potential VEVL held by the capacitance element C2 is an electric potential that corresponds to the reference value (the reference data based on the MTJ element in the P state). The electric potential VEVL of the capacitance element C2 is applied to (and thus reflected in) the node ND5.

The node ND4 is connected to a first terminal of the conversion circuit 152. The electric potential VSMP of the capacitance element C1 is output to the conversion circuit 152 from the node ND4.

The node ND5 is connected to a second terminal of the conversion circuit 152. The electric potential VEVL of the capacitance element C2 is output to the conversion circuit 152 from the node ND5.

Configuration Examples of Conversion Circuit, Second Sense Amplifier Circuit, and Selection Circuit Configuration examples of the conversion circuit, the second sense amplifier circuit, and the selection circuit in the read circuit of the MRAM of the present embodiment will be described with reference to FIG. 7.

Figure 7:
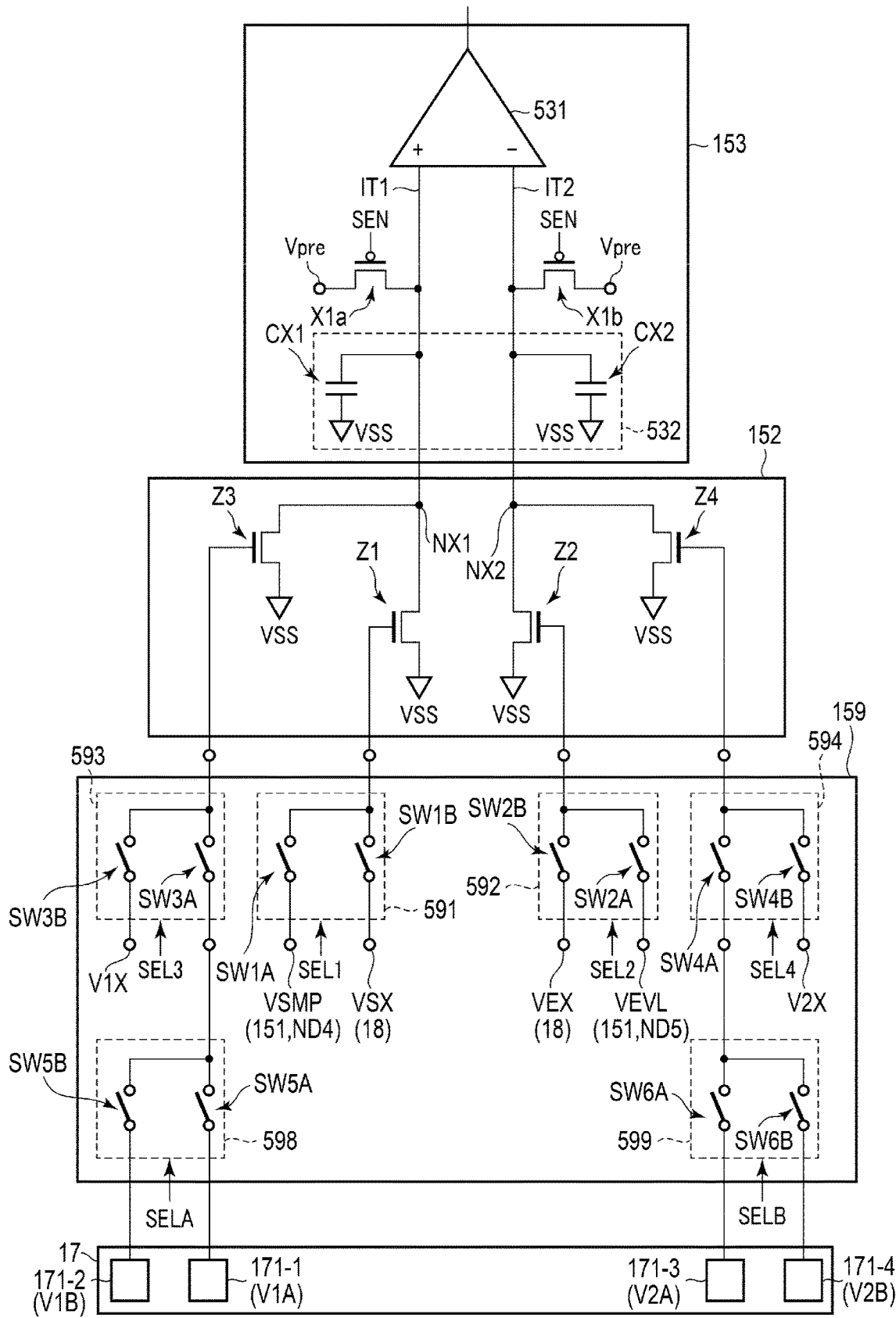

FIG. 7 is a circuit diagram schematically illustrating the configuration examples of the conversion circuit, the second sense amplifier circuit, and the selection circuit in the read circuit of the MRAM of the present embodiment.

As illustrated in FIG. 7, the conversion circuit 152 includes four N-type field effect transistors Z1, Z2, Z3, and Z4.

One end of the current path of the transistor Z1 is connected to a first input terminal IT1 of the second sense amplifier circuit 153 through a node NX1. The other end of the current path of the transistor Z1 is connected to the ground terminal VSS. The gate of the transistor Z1 is connected to the selection circuit 159.

One end of the current path of the transistor Z2 is connected to a second input terminal IT2 of the sense amplifier circuit 153 through a node NX2. The other end of the current path of the transistor Z2 is connected to the ground terminal VSS. The gate of the transistor Z2 is connected to the selection circuit 159.

One end of the current path of the transistor Z3 is connected to the input terminal IT1 of the sense amplifier circuit 153 through the node NX1. The other end of the current path of the transistor Z3 is connected to the ground terminal VSS. The gate of the transistor Z3 is connected to the selection circuit 159.

One end of the current path of the transistor Z4 is connected to the input terminal IT2 of the sense amplifier circuit 153 through the node NX2. The other end of the current path of the transistor Z4 is connected to the ground terminal VSS. The gate of the transistor Z4 is connected to the selection circuit 159.

The second sense amplifier circuit 153 is connected to the conversion circuit 152. The second sense amplifier circuit 153 includes a comparison circuit 531 and an amplification circuit 532.

The comparison circuit 531 compares the magnitudes of two signals from the conversion circuit 152. The comparison circuit 531 includes the two input terminals IT1 and IT2 of the second sense amplifier circuit 153. One input terminal (for example, a non-inverting input terminal) IT1 of the comparison circuit 531 is connected to the node NX1. The other input terminal (for example, an inverting input terminal) IT2 of the comparison circuit 531 is connected to the node NX2.

The amplification circuit 532 can amplify signals from the conversion circuit 152. The amplification circuit 532 includes two capacitance elements CX1 and CX2.

One end of the capacitance element CX1 is connected to one input terminal IT1 of the comparison circuit 531. The other end of the capacitance element CX1 is connected to the ground terminal VSS. One end of the capacitance element CX2 is connected to the other input terminal IT2 of the comparison circuit 531. The other end of the capacitance element CX2 is connected to the ground terminal VSS. The capacitance elements CX1 and CX2 are not limited to fixed capacitance elements and may be wiring capacitances.

P-type transistors X1, X1*b* are respectively connected to the input terminals IT1 and IT2 of the comparison circuit 531. One end of the current path of the transistor X1*a* is connected to the input terminal IT1 and one end of the current path of the transistor X1*b* is connected to the input terminal IT2. The other ends of the current paths of the transistors X1*a*, X1*b* are each connected to a terminal (hereinafter, referred to as a voltage terminal Vpre) to which a precharging voltage Vpre is applied. A control signal (sense enable signal SEN) is supplied to the gates of the transistors X1*a*, X1*b*. Precharging of the input terminals IT1 and IT2 and the nodes NX1 and NX2 is controlled by ON/OFF of the transistors X1*a*, X1*b*.

The selection circuit 159 includes a plurality of switch circuits 591, 592, 593, 594, 598, and 599.

The switch circuit 591 is connected to the preamplifier circuit 151 and the external voltage supply circuit 18. The switch circuit 591 includes two switches SW1A and SW1B. One end of the switch SW1A is electrically connected to the node ND4 of the preamplifier circuit 151. The other end of the switch SW1A is electrically connected to the gate of the transistor Z1. One end of the switch SW1B is electrically connected to the external voltage supply circuit 18. The other end of the switch SW1B is electrically connected to the gate of the transistor Z1.

The voltage VSMP is supplied to the one end of the switch SW1A. The voltage VSX is supplied to the one end of the switch SW1B. The voltage VSMP corresponds to the cell signal before writing of the reference data.

A control signal SEL1 is supplied to the switch circuit 591. ON/OFF of the two switches SW1A and SW1B is controlled depending on the control signal SEL1. When the switch SW1A is set to be in the ON state based on the control signal SEL1, the voltage VSMP (cell signal) from the preamplifier circuit 151 is applied to the gate of the transistor Z1. When the switch SW1A is in the ON state, the switch SW1B is set to be in the OFF state. When the switch SW1B is set to be in the ON state based on the control signal SEL1, the voltage VSX from the external voltage supply circuit 18 is supplied to the gate of the transistor Z1. When the switch SW1B is in the ON state, the switch SW1A is set to be in the OFF state.

The switch circuit 592 is connected to the preamplifier circuit 151 and the external voltage supply circuit 18. The switch circuit 592 includes two switches SW2A and SW2B. One end of the switch SW2A is electrically connected to the node ND5 of the preamplifier circuit 151. The other end of the switch SW2A is electrically connected to the gate of the transistor Z2. One end of the switch SW2B is electrically connected to the external voltage supply circuit 18. The other end of the switch SW2B is electrically connected to the gate of the transistor Z2.

The voltage VEVL is supplied to the one end of the switch SW2A. The voltage VEX is supplied to the one end of the switch SW2B. The voltage VEVL corresponds to the cell signal (reference signal) after writing of the reference data.

A control signal SEL2 is supplied to the switch circuit 592. ON/OFF of the two switches SW2A and SW2B is controlled depending on the control signal SEL2. When the switch SW2A is set to be in the ON state based on the control signal SEL2, the voltage VEVL (reference signal) from the preamplifier circuit 151 is applied to the gate of the transistor Z2. When the switch SW2A is in the ON state, the switch SW2B is set to be in the OFF state. When the switch SW2B is set to be in the ON state based on the control signal SEL2, the voltage VEX from the external voltage supply circuit 18 is applied to the gate of the transistor Z2. When the switch SW2B is in the ON state, the switch SW2A is set to be in the OFF state.

The switch circuit 593 is connected to the voltage generation circuit 17 and the external voltage supply circuit 18. The switch circuit 593 includes two switches SW3A and SW3B. One end of the switch SW3A is electrically connected to offset voltage generation circuits 171-1 and 171-2 of the voltage generation circuit 17 through the switch circuit 598. The other end of the switch SW3A is electrically connected to the gate of the transistor Z3. One end of the switch SW3B is electrically connected to the external voltage supply circuit 18. The other end of the switch SW3B is electrically connected to the gate of the transistor Z3.

A voltage V1A from the offset voltage generation circuit 171-1 or a voltage V1B from the offset voltage generation circuit 171-2 is supplied to the one end of the switch SW3A. A voltage V1X from the external voltage supply circuit 18 is supplied to the one end of the switch SW3B.

A control signal SEL3 is supplied to the switch circuit 593. ON/OFF of the two switches SW3A and SW3B is controlled depending on the control signal SEL3. When the switch SW3A is set to be in the ON state based on the control signal SEL3, the offset voltage V1A or the offset voltage V1B is supplied to the gate of the transistor Z3. When the switch SW3A is in the ON state, the switch SW3B is set to be in the OFF state. When the switch SW3B is set to be in the ON state based on the control signal SEL3, the voltage V1X is supplied to the gate of the transistor Z3. When the switch SW3B is in the ON state, the switch SW3A is set to be in the OFF state.

The switch circuit 594 is connected to the voltage generation circuit 17 and the external voltage supply circuit 18.

The switch circuit 594 includes two switches SW4A and SW4B. One end of the switch SW4A is electrically connected to offset voltage generation circuits 171-3 and 171-4 of the voltage generation circuit 17 through the switch circuit 599. The other end of the switch SW4A is electrically connected to the gate of the transistor Z4. One end of the switch SW4B is electrically connected to the external voltage supply circuit 18. The other end of the switch SW4B is electrically connected to the gate of the transistor Z4.

A voltage V2A from the offset voltage generation circuit 171-3 or a voltage V2B from the offset voltage generation circuit 171-4 is supplied to the one end of the switch SW4A. A voltage V2X from the external voltage supply circuit 18 is supplied to the one end of the switch SW4B.

A control signal SEL4 is supplied to the switch circuit 594. ON/OFF of the two switches SW4A and SW4B is controlled depending on the control signal SEL4. When the switch SW4A is set to be in the ON state based on the control signal SEL4, the offset voltage V2A or the offset voltage V2B is supplied to the gate of the transistor Z4. When the switch SW4A is in the ON state, the switch SW4B is set to be in the OFF state. When the switch SW4B is set to be in the ON state based on the control signal SEL4, the voltage V2X is supplied to the gate of the transistor Z4. When the switch SW4B is in the ON state, the switch SW4A is set to be in the OFF state.

The switch circuit 598 includes switches SW5A and SW5B. One end of the switch SW5A is electrically connected to one end of the switch SW3A. The other end of the switch SW5A is electrically connected to the offset voltage generation circuit 171-1. One end of the switch SW5B is electrically connected to one end of the switch SW3A. The other end of the switch SW5B is electrically connected to the offset voltage generation circuit 171-2.

The offset voltage generation circuit 171-1 outputs the offset voltage V1A (which is, for example, greater than VSS). The offset voltage generation circuit 171-2 outputs the offset voltage V1B (which is, for example, the ground voltage VSS).

A control signal SELA is supplied to the switch circuit 598. ON/OFF of the two switches SWSA and SWSB is controlled depending on the control signal SELA. Accordingly, the selected offset voltage generation circuit 171 is electrically connected to the switch SW3A. When the switch SWSA is set to be in the ON state based on the control signal SELA, the offset voltage V1A is supplied to the one end of the switch SW3A. When the switch SWSA is in the ON state, the switch SWSB is set to be in the OFF state. When the switch SWSB is set to be in the ON state based on the control signal SELA, the offset voltage V1B (for example, the ground voltage VSS) is supplied to the one end of the switch SW3A. When the switch SWSB is in the ON state, the switch SWSA is set to be in the OFF state.

The switch circuit 599 includes switches SW6A and SW6B. One end of the switch SW6A is electrically connected to one end of the switch SW4A. The other end of the switch SW6A is electrically connected to the offset voltage generation circuit 171-3. One end of the switch SW6B is electrically connected to one end of the switch SW4A. The other end of the switch SW6B is electrically connected to the offset voltage generation circuit 171-4.

The offset voltage generation circuit 171-3 outputs the offset V2A (which is, for example, greater than VSS). The offset voltage generation circuit 171-4 outputs the offset V2B (which is, for example, the ground voltage VSS).

A control signal SELB is supplied to the switch circuit 599. ON/OFF of the two switches SW6A and SW6B is controlled depending on the control signal SELB. Accordingly, the selected offset voltage generation circuit 171 is electrically connected to the switch SW4A. When the switch SW6A is set to be in the ON state based on the control signal SELB, the offset voltage V2A is supplied to the one end of the switch SW4A. When the switch SW6A is in the ON state, the switch SW6B is set to be in the OFF state. When the switch SW6B is set to be in the ON state based on the control signal SELB, the offset voltage V2B (for example, the ground voltage VSS) is supplied to the one end of the switch SW4A. When the switch SW6B is in the ON state, the switch SW6A is set to be in the OFF state.

In such a manner, the second sense amplifier circuit 153 is connected to the preamplifier circuit 151, the voltage generation circuit 17, and the external voltage supply circuit 18 under control of the selection circuit 159.

Configuration Example of External Voltage Supply Circuit

A configuration example of the external voltage supply circuit in the MRAM of the present embodiment will be described with reference to FIG. 8.

Figure 8:
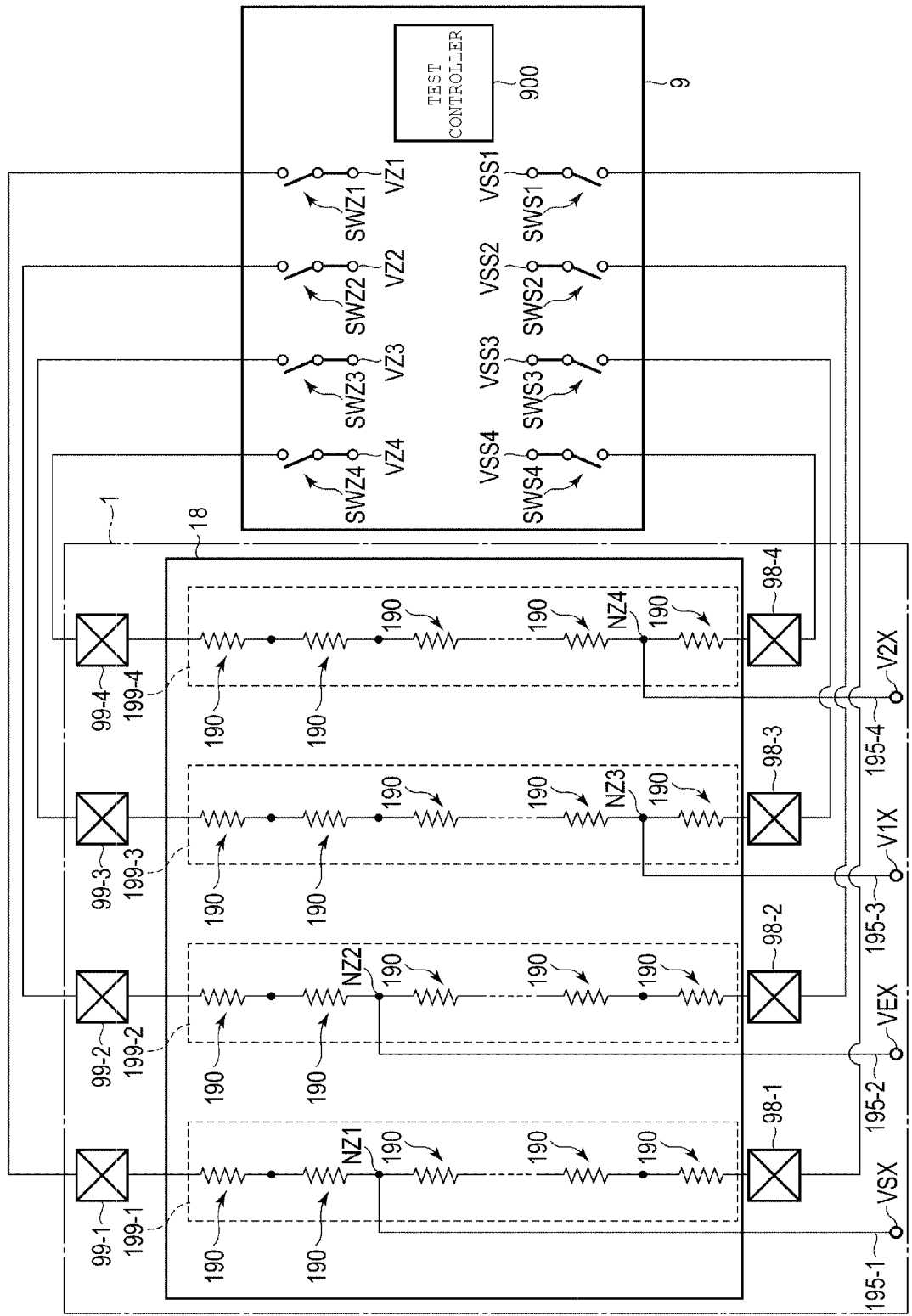
FIG. 8 is a circuit diagram schematically illustrating a configuration example of an external voltage supply circuit of the memory device of the first embodiment.

FIG. 8 is a circuit diagram schematically illustrating the configuration example of the external voltage supply circuit in the MRAM of the present embodiment. In FIG. 8, the test device that is connected to the external voltage supply circuit at the time of the test operation of the MRAM of the present embodiment is also described.

As illustrated in FIG. 8, the external voltage supply circuit 18 includes a plurality of voltage output circuits (referred to as resistor voltage division circuits or resistance circuits) 199 (199-1, 199-2, 199-3, and 199-4).

The voltage output circuit 199-1 includes external connection terminals 99-1 and 98-1 and an output terminal 195-1. The terminal 99-1 is disposed at one end of the voltage output circuit 199-1, and the terminal 98-1 is disposed at the other end of the voltage output circuit 199-1. The output terminal 195-1 is connected to a node between the two terminals 98-1 and 99-1. A voltage VZ1 is applied to the terminal 99-1, and a voltage VSS1 is applied to the terminal 98-1. The voltage output circuit 199-1 generates the voltage VSX using the voltage VZ1 and the voltage VSS1. The voltage output circuit 199-1 outputs the voltage VSX from the output terminal 195-1.

The voltage output circuit 199-2 includes external connection terminals 98-2 and 99-2 and an output terminal 195-2. The terminal 99-2 is disposed at one end of the voltage output circuit 199-2, and the terminal 98-2 is disposed at the other end of the voltage output circuit 199-2. The output terminal 195-2 is connected to a node between the two terminals 98-2 and 99-2. A voltage VZ2 is applied to the terminal 99-2, and a voltage VSS2 is applied to the terminal 98-2. The voltage output circuit 199-2 generates the voltage VEX using the voltage VZ2 and the voltage VSS2. The voltage output circuit 199-2 outputs the voltage VEX from the output terminal 195-2.

The voltage output circuit 199-3 includes external connection terminals 98-3 and 99-3 and an output terminal 195-3. The terminal 99-3 is disposed at one end of the voltage output circuit 199-3, and the terminal 98-3 is disposed at the other end of the voltage output circuit 199-3. The output terminal 195-3 is connected to a node between the two terminals 98-3 and 99-3. A voltage VZ3 is applied to the terminal 99-3, and a voltage VSS3 is applied to the terminal 98-3. The voltage output circuit 199-3 generates the voltage V1X using the voltage VZ3 and the voltage VSS3. The voltage output circuit 199-3 outputs the voltage V1X from the output terminal 195-3 of the voltage output circuit 199-3.

The voltage output circuit 199-4 includes external connection terminals 98-4 and 99-4 and an output terminal 195-4. The terminal 99-4 is disposed at one end of the voltage output circuit 199-4, and the terminal 98-4 is disposed at the other end of the voltage output circuit 199-4. The output terminal 195-4 is connected to a node between the two terminals 98-4 and 99-4. A voltage VZ4 is applied to the terminal 99-4, and a voltage VSS4 is applied to the terminal 98-4. The voltage output circuit 199-4 generates the voltage V2X using the voltage VZ4 and the voltage VSS4.

The voltage output circuit 199-4 outputs the voltage V2X from the output terminal 195-4 of the voltage output circuit 199-4.

The voltage output circuits 199-1 and 199-2 respectively supply the voltages VSX and VEX corresponding to 1/N of the voltages VZ1 and VZ2 to the selection circuit 159 by voltage division. The voltage output circuits 199-3 and 199-4 respectively supply the voltages V1X and V2X corresponding to 1/M of the voltages VZ3 and VZ4 to the selection circuit 159 by voltage division.

For example, the voltage output circuits 199-1 and 199-2 are used for adjustment (hereinafter, referred to as coarse adjustment) in which voltage adjustment with relatively low accuracy is allowed. For example, the voltage output circuits 199-3 and 199-4 are used for adjustment (hereinafter, referred to as fine adjustment) in which voltage adjustment with relatively high accuracy is requested.

The voltage output circuit 199 includes a plurality of resistance elements 190. In the voltage output circuit 199, the plurality of resistance elements 190 are serially connected between the external connection terminal 99 on a high electric potential side (power supply side) and the external connection terminal 98 on a low electric potential side (ground side). Each of the resistance elements 190 has a resistance value R1.

The voltage output circuit 199 is configured to have a predetermined resistance ratio. The resistance ratio of the voltage output circuit 199 can be adjusted depending on which node of a plurality of connection nodes of the serially connected resistance elements 190 is connected to the output terminal 195 (195-1, 195-2, 195-3, and 195-4).

In the voltage output circuit 199-1, the output terminal 195-1 is connected to a connection node NZ1 between the resistance elements 190. Accordingly, the voltage output circuit 199-1 has a resistance ratio RR1. For example, the voltage value of the output voltage VSX of the voltage output circuit 199-1 is set to approximately ½ of the voltage value of the input voltage VZ1.

In the voltage output circuit 199-2, the output terminal 195-2 is connected to a connection node NZ2 between the resistance elements 190. Accordingly, the voltage output circuit 199-2 has a resistance ratio RR2. The resistance ratio RR2 may be the same or different from the resistance ratio RR1. For example, the voltage value of the output voltage VEX of the resistance circuit 199-2 is set to approximately ½ of the voltage value of the input voltage VZ2.

In the resistance circuit 199-3, the output terminal 195-3 is connected to a connection node NZ3 between the resistance elements 190. Accordingly, the resistance circuit 199-3 has a resistance ratio RR3. For example, the resistance ratio RR3 is higher than the resistance ratio RR1. For example, the voltage value of the output voltage V1X of the resistance circuit 199-3 is set to approximately ¹⁄₁₀ of the voltage value of the input voltage VZ3.

In the resistance circuit 199-4, the output terminal 195-4 is connected to a connection node NZ4 between the resistance elements 190. Accordingly, the resistance circuit 199-4 has a resistance ratio RR4. For example, the resistance ratio RR4 is higher than the resistance ratio RR1. The resistance ratio RR4 may be the same or different from the resistance ratio RR3. For example, the voltage value of the output voltage V2X of the resistance circuit 199-4 is set to approximately ¹⁄₁₀ of the voltage value of the input voltage VZ4.

In such a manner, in the present embodiment, the resistance value of the resistance circuit 199 can be adjusted depending on the position at which the output terminal 195 is connected to the plurality of serially connected resistance elements 190. Accordingly, the resistance circuit 199 can supply a voltage having a predetermined voltage value to the read circuit 15.

For example, each resistance element 190 may be formed using at least one of a polysilicon resistance element, a metal resistance element, a diffusion layer resistance element, a variable resistance element, and the like.

As described above, at the time of the test operation, the external voltage supply circuit 18 is connected to the test device 9 through the external connection terminals 98 and 99.

For example, the test device 9 includes a test controller 900 and a plurality of switches SWZ (SWZ1, SWZ2, SWZ3, and SWZ4) and SWS (SWS1, SWS2, SWS3, and SWS4). The test device 9 outputs the voltages VZ1, VZ2, VZ3, and VZ4 and the voltages VSS1, VSS2, VSS3, and VSS4 depending on ON/OFF control of the switches SWZ and SWS by the test controller 900.

The test controller 900 can control the internal operation of the test device 9 at the time of the test operation. The test controller 900 can control ON/OFF of the switches SWZ and SWS at the time of the test operation.

The voltage VZ1 is applied to one end of the switch SWZ1. At the time of the test operation, the other end of the switch element SWZ1 is connected to the external connection terminal 99-1. The voltage VZ2 is applied to one end of the switch SWZ2. At the time of the test operation, the other end of the switch element SWZ2 is connected to the external connection terminal 99-2. The voltage VZ3 is applied to one end of the switch SWZ3. At the time of the test operation, the other end of the switch element SWZ3 is connected to the external connection terminal 99-3. The voltage VZ4 is applied to one end of the switch SWZ4. At the time of the test operation, the other end of the switch element SWZ4 is connected to the external connection terminal 99-4.

The voltage VSS1 is applied to one end of the switch SWS1. At the time of the test operation, the other end of the switch element SWS1 is connected to the external connection terminal 98-1. The voltage VSS2 is applied to one end of the switch SWS2. At the time of the test operation, the other end of the switch element SWS2 is connected to the external connection terminal 98-2. The voltage VSS3 is applied to one end of the switch SWS3. At the time of the test operation, the other end of the switch element SWS3 is connected to the external connection terminal 98-3. The voltage VSS4 is applied to one end of the switch SWS4. At the time of the test operation, the other end of the switch element SWS4 is connected to the external connection terminal 98-4.

For example, the voltages VZ1, VZ2, VZ3, and VZ4 are voltages having positive voltage values. The voltages VSS1, VSS2, VSS3, and VSS4 are reference voltages (for example, the ground voltage). The voltages VZ1, VZ2, VZ3, and VZ4 may have different voltage values or may have the same voltage value. In addition, by setting the switches SWS1, SWS2, SWS3, and SWS4 to be in the OFF state, the voltages VZ1, VZ2, VZ3, and VZ4 having the same magnitude may be applied to each terminal (wiring, a node and/or an element).

At the time of the shipment of the memory device 1 or the time of the return of the memory device 1, the characteristics (for example, the resistance value, the magnitude of the output signal, and/or detection of short/open failure) of the memory element may be tested.

In the memory device of the present embodiment, the above configuration enables the characteristics of the memory element to be examined with relatively high accuracy using an external voltage.

(b) Operation Example

An operation example of the MRAM of the present embodiment will be described with reference to FIG. 9 to FIG. 13. FIG. 1 to FIG. 8 will also be appropriately used for describing the operation example of the MRAM of the present embodiment.

In the MRAM of the present embodiment, a write operation based on a well-known spin transfer torque (STT) method may be used for writing of data into the memory cell. Accordingly, the write operation will not be described in the present embodiment. A write method (for example, a magnetic field write method or a voltage pulse write method) other than the STT method may also be applied to the write operation of the MRAM of the present embodiment, provided that the direction of magnetization of the storage layer of the MTJ element can be controlled.

(b-1) First Read Operation

A first read operation of the MRAM of the present embodiment will be described with reference to FIG. 9 and FIG. 10.

Figure 9:
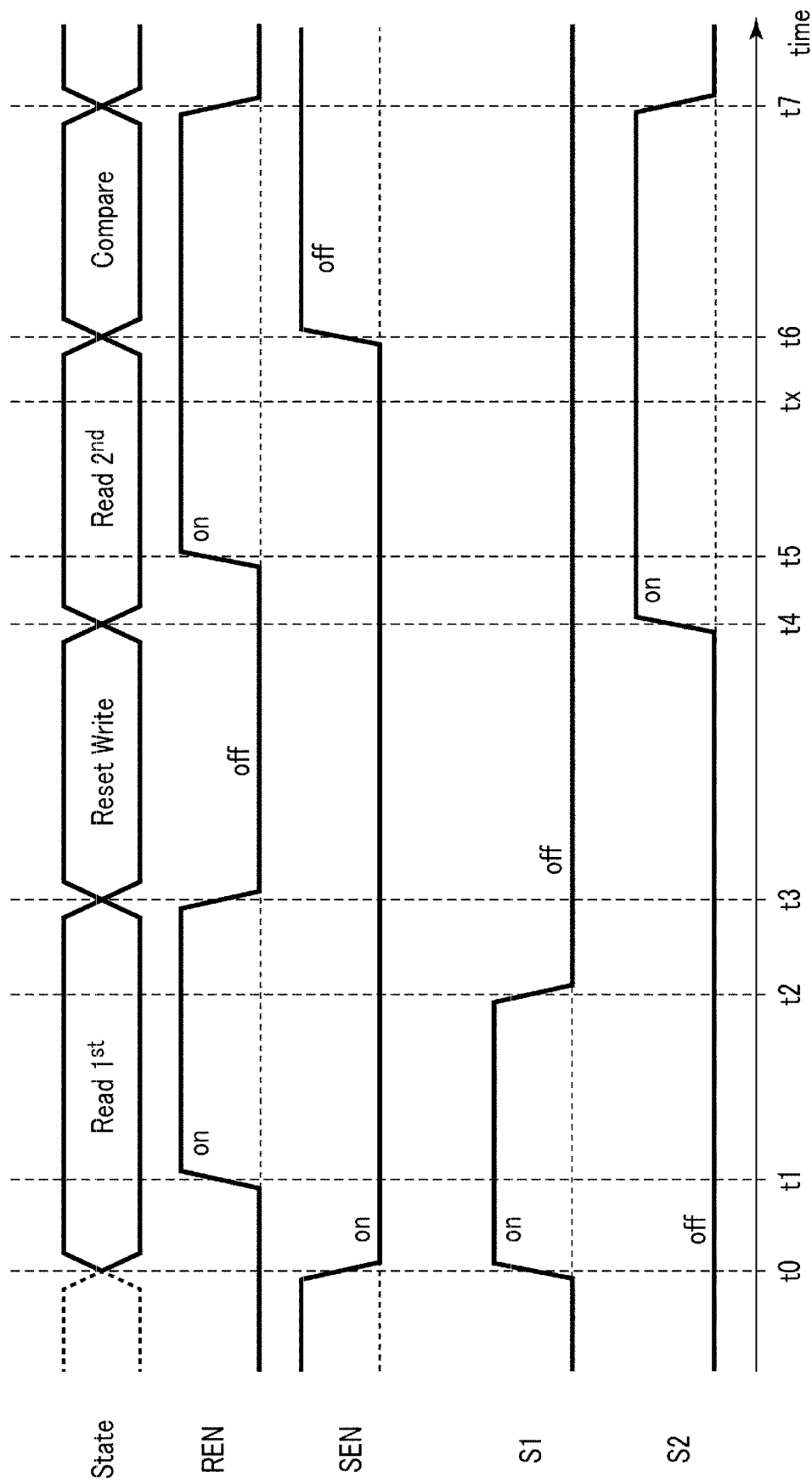
FIGS. 9-10 are diagrams illustrating a first read operation carried out in the memory device of the first embodiment.

FIG. 9 is a timing chart for describing the first read operation of the MRAM of the present embodiment.

When the host device requests the controller 5 to read data, the controller 5 transmits a read command, the selection address ADR, and the control signal CNT to the MRAM 1 of the present embodiment.

The MRAM 1 of the present embodiment starts reading data from the memory cell at the selection address ADR based on the read command CMD.

In the sequence (see FIG. 4) of the read operation of the MRAM of the present embodiment based on the self-reference method, the control circuit 19 executes the first data read on the selected cell MCk.

The row control circuit 13B activates at least one of the plurality of word lines WL in the memory cell array 10 based on the result of decoding of the selection address ADR by the row decoder 13A.

The column control circuit 14B activates at least one of the plurality of bit line pairs (also referred to herein as the bit line BL and the source line bBL) in the memory cell array 10 based on the result of decoding of the selection address ADR by the column decoder 14A.

The column control circuit 14B connects the read circuit 15 to the activated bit line BL and the activated source line bBL. Hereinafter, the bit line BL that is activated based on the selection address ADR will be referred to as a selected bit line. In addition, the source line bBL that is activated based on the selection address ADR will be referred to as a selected source line.

The control circuit 19 activates the read circuit 15. The preamplifier circuit 151 is electrically connected to the selected bit line BL. The ground terminal VSS is connected to the selected source line bBL. Accordingly, the first data read (corresponding to reading of the user data) for the selected cell MCk is executed as follows.

At time t0, the control circuit 19 sets the switch S1 to be in the ON state. At this point, the switch S2 is set to be in the OFF state. Accordingly, in the preamplifier circuit 151 in FIG. 6, at the time of the first data read, the switch S1 in the ON state electrically connects the capacitance element C1 to the node ND3. The switch S2 in the OFF state electrically isolates the capacitance element C2 from the node ND3.

The transistor Q5 acts as a load diode with respect to the node ND3.

The control circuit 19 transitions the signal level of the sense enable signal SEN to an "L" level from an "H" level. The signal SEN at the "L" level sets the P-type transistors X1a, X1b to be in the ON state. Accordingly, the input terminals IT1 and IT2 of the second sense amplifier circuit 153 are charged using the precharging voltage Vpre.

At time t1, the control circuit 19 transitions the read enable signal REN to the "H" level from the "L" level. The signal REN at the "H" level sets the transistor Q4 to be in the ON state. The preamplifier circuit 151 is electrically connected to the selected cell MCk through the transistor Q4 in the ON state.

Accordingly, the read current IRDa flows in the selected cell MCk. The electric potential of the bit line BL is controlled by the clamp transistor Q3. A current Ix1 that corresponds to the read current IRDa flows in the node ND3 and the transistor Q5 by the transistors Q1 and Q2 that form a current mirror circuit. The current Ix1 charges the capacitance element C1.

In such a manner, by the first data read, the cell signal of the selected cell MCk storing data is supplied to the preamplifier circuit 151 in the read circuit 15. The electric potential VSMP corresponding to the cell signal is held in the capacitance element C1. The electric potential VSMP held in the capacitance element C1 corresponds to the cell signal before writing of the reference data.

At time t2, the control circuit 19 sets the switch S1 to be in the OFF state at a timing after an elapse of a predetermined period for charging the capacitance element C1. Accordingly, the capacitance element C1 is electrically isolated from the node ND3.

At time t3, the control circuit 19 transitions the signal level of the read enable signal REN to the "L" level from the "H" level. Accordingly, the transistor Q4 is set to be in the OFF state. The preamplifier circuit 151 is temporarily electrically isolated from the selected cell MCk.

After the first data read, in a period from time t3 to time t4, the control circuit 19 writes the reference data (reset write operation) into the selected cell MCk as follows.

The column control circuit 14B electrically isolates the read circuit 15 from the selected cell under control of the control circuit 19. The column control circuit 14B electrically connects the write circuit 16 to the selected cell MCk.

The write circuit 16 supplies the write current (a write current of data of "0") IWR for writing the reference data to the selected cell MCk under control of the control circuit 19. Accordingly, the reference data (for example, data of "0") is written into the selected cell MCk. For example, the magnetization arrangement state of the MTJ element 100 in the selected cell MCk is set to the P state.

After writing of the reference data, the control circuit 19 executes a second data read (reading of the reference data) for the selected cell MCk on the selected cell MCk.

The column control circuit 14B electrically isolates the write circuit 16 from the selected cell MCk under control of the control circuit 19. The column control circuit 14B electrically connects the read circuit 15 to the selected cell MCk.

At time t4, the control circuit 19 sets the switch S2 to be in the ON state. At this point, the switch S1 is set to be in the OFF state. Accordingly, in the preamplifier circuit 151 in FIG. 6, at the time of the second data read, the switch S2 in the ON state electrically connects the capacitance element C2 to the node ND3. The switch S1 in the OFF state electrically isolates the capacitance element C1 from the node ND3.

At time t5, the control circuit 19 transitions the signal level of the read enable signal REN to the "H" level from the "L" level. The signal REN at the "H" level sets the transistor Q4 to be in the ON state.

Accordingly, the read current IRDb flows in the selected cell MCk. A current Ix2 that corresponds to the read current IRDb flows in the node ND3 by the transistors Q1 and Q2 that form a current mirror circuit. The current Ix2 charges the capacitance element C2.

The gate voltage of the transistor Q5 corresponds to the electric potential of the capacitance element C1. The transistor Q5 outputs a current using a drive power corresponding to the electric potential of the capacitance element C1.

Accordingly, in the second data read (reading of the reference data), the capacitance element C2 is charged to the electric potential of an operating point that is based on the output characteristics of the transistor Q2 operating depending on the output signal of the selected cell MCk (the MTJ element 100 in the P state) holding the reference data and the output characteristics of the transistor Q5 operating depending on the charging electric potential of the capacitance element C1 caused by the first data read.

Accordingly, the capacitance element C2 holds the electric potential VEVL. The electric potential VEVL corresponds to the cell signal after writing of the reference data.

As described so far, the first and second data reads charge the capacitance elements C1 and C2 of the preamplifier circuit 151, respectively.

At time tx, the control circuit 19 supplies the voltages VSMP and VEVL corresponding to the output from the selected cell MCk in the preamplifier circuit 151 to the second sense amplifier circuit 153 by controlling the selection circuit 159.

Figure 10:
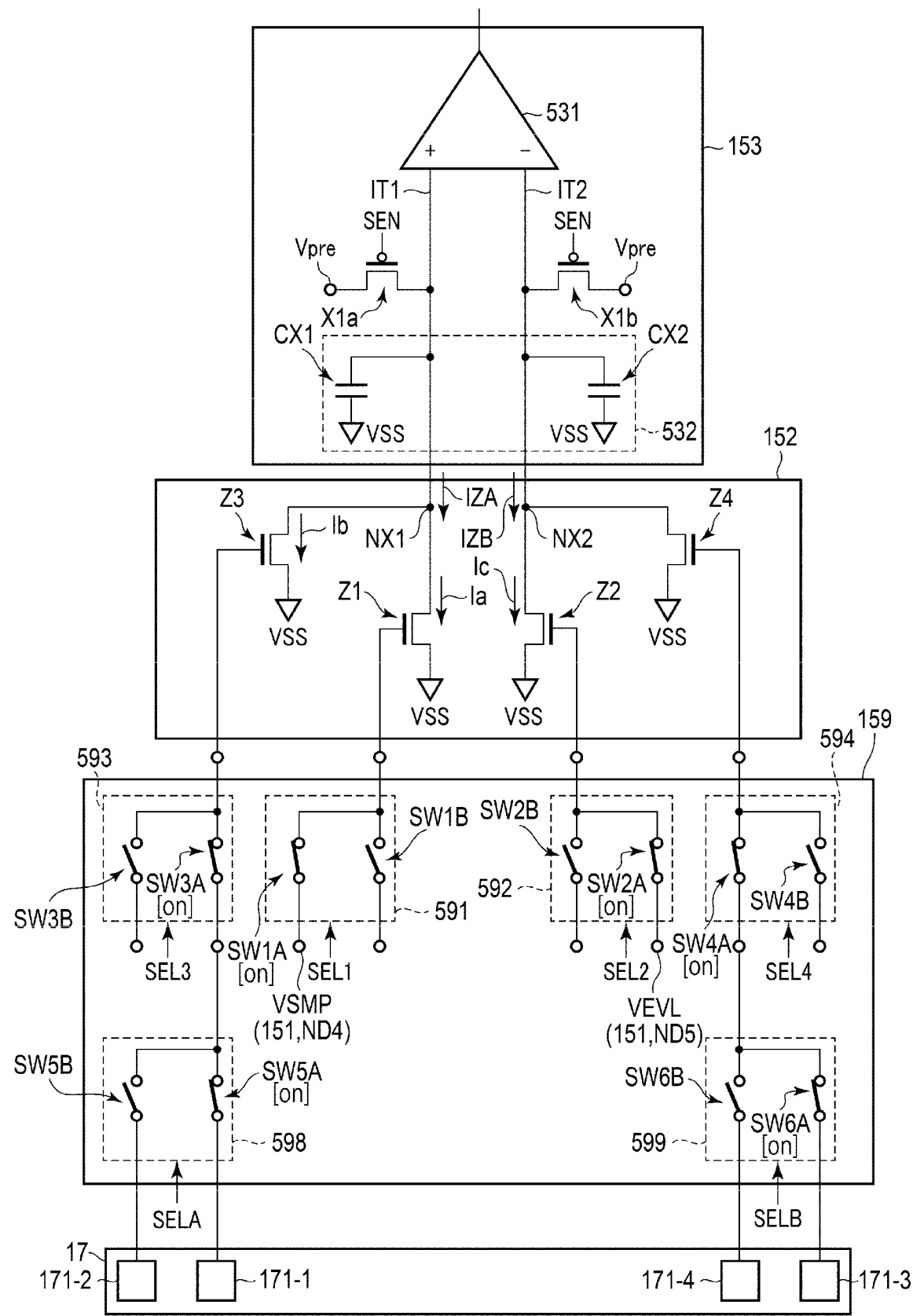

FIG. 10 is a schematic diagram illustrating the voltage supplied to the second sense amplifier circuit at time tx in the read operation of the MRAM of the present embodiment.

As illustrated in FIG. 10, the control circuit 19 sets the switch SW1A of the switch circuit 591 to be in the ON state using the control signal SEL1. The switch SW1B is set to be in the OFF state. The capacitance element C1 is electrically connected to the gate of the transistor Z1 through the switch SW1A in the ON state. Accordingly, the electric potential VSMP of the capacitance element C1 is applied to the gate of the transistor Z1.

The control circuit 19 sets the switch SW2A of the switch circuit 592 to be in the ON state using the control signal SEL2. The switch SW2B is set to be in the OFF state. The capacitance element C2 is electrically connected to the gate of the transistor Z2 through the switch SW2A in the ON state. Accordingly, the electric potential VEVL of the capacitance element C2 is applied to the gate of the transistor Z2.

The transistor Z1 causes a current corresponding to the electric potential VSMP of the gate voltage to flow therethrough. The transistor Z2 causes a current corresponding to the electric potential VEVL of the gate voltage to flow therethrough.

For example, in the reading based on the self-reference method, when the reference value is generated using the MTJ element in the P state, the offset voltage V1A is applied to the gate of the transistor Z3 in order to offset the cell signal.

The control circuit 19 sets the switch SW3A of the switch circuit 593 to be in the ON state using the control signal SEL3. In addition, the control circuit 19 sets the switch SW5A of the switch circuit 598 to be in the ON state using the control signal SELA. The offset voltage generation circuit 171-1 is connected to the gate of the transistor Z3 through the switches SW3A and SW5A in the ON state. Accordingly, the offset voltage V1A is applied to the gate of the transistor Z3.

The transistors Z1 and Z3 to which the gate voltage is applied cause a current IZA to flow in the node NX1. The current IZA is the total current of an output current Ia of the transistor Z1 and an output current Ib of the transistor Z3.

A current IZB flows in the node NX2. The current IZB is an output current Ic of the transistor Z2.

An offset may be applied to the reference signal (voltage VEVL). In this case, the control circuit 19 sets the switch SW4A of the switch circuit 594 to be in the ON state using the control signal SEL4. The control circuit 19 sets the switch SW6A of the switch circuit 599 to be in the ON state using the control signal SELB. The offset voltage generation circuit 171-3 is connected to the gate of the transistor Z4 through the switches SW4A and SW4B in the ON state. Accordingly, the offset voltage V2A is applied to the gate of the transistor Z4. The current of the transistor Z4 applies an offset to the current IZB corresponding to the reference signal.

When the MTJ element 100 before writing of the reference data into the selected cell MCk is in the AP state, the current value of the current IZA is lower than the current value of the current IZB.

When the MTJ element 100 before writing of the reference data into the selected cell MCk is in the P state, the current value of the current IZA is higher than the current value of the current IZB.

At this point (time t5), the electric potentials of the capacitance elements CX1 and CX2 are maintained at approximately the voltage Vpre.

At time t6, the comparison circuit 531 of the second sense amplifier circuit 153 performs a comparison operation.

The control circuit 19 transitions the signal level of the sense enable signal SEN to the "H" level from the "L" level. Accordingly, the transistors X1a, X1b are set to be in the OFF state. The input terminals IT1 and IT2 are electrically isolated from the voltage terminal Vpre.

The discharging amount of the capacitance element CX1 caused by the transistors Z1 and Z3 is different from the discharging amount of the capacitance element CX2 caused by the transistor Z2. Accordingly, a difference in electric potential between the capacitance element CX1 and the capacitance element CX2 is increased along with an elapse of time.

At a timing after an elapse of a predetermined period from time t6, the comparison circuit 531 compares the electric potential of the input terminal IT1 with the electric potential of the input terminal IT2. A signal corresponding to the comparison result is output from the comparison circuit 531. The signal output from the comparison circuit 531 is latched in a data holding circuit (not illustrated). The signal from the comparison circuit 531 may be held in the latch circuit 11.

The data of the selected cell MCk is determined based on the signal from the comparison circuit 531.

Accordingly, the data of the selected cell MCk is read.

At time t7, the control circuit 19 transitions the signal level of the read enable signal REN to the "L" level from the "H" level. The preamplifier circuit 151 is electrically isolated from the selected cell MCk.

The control circuit 19 sets the switch S2 of the preamplifier circuit 151 to be in the OFF state. The switch S2 may be set to be in the OFF state at time t6. The control circuit 19 sets the switches SW1A, SW2A, SW3A, and SW5A to be in the OFF state using the control signals SEL1, SEL2, SEL3, and SELA. Accordingly, the second sense amplifier circuit 153 is electrically isolated from the preamplifier circuit 151 by the selection circuit 159.

The control circuit 19 transmits the data read from the selected cell MCk to the controller 5 (or the host device) through the I/O circuit 12.

By the control described thus far, the read operation of the MRAM of the present embodiment is finished.

In such a manner, in the present embodiment, data in the MRAM 1 is read by the read operation based on the self-reference method in response to the request of the host device (user).

(b-2) Second Read Operation

A second read operation of the MRAM of the present embodiment will be described with reference to FIG. 11 and FIG. 12.

In the MRAM of the present embodiment, the second read operation is executed in a test step for the MRAM such as the test operation (for example, screening) before the shipment of the MRAM (a chip, a package, or a module) or the test operation at the time of the return of the MRAM.

At the time of such a test operation, for example, the external voltage is supplied to the MRAM 1 of the present embodiment from the controller (processor) 5 or the test device 9 through the external connection terminal 99.

In the test step, the test device 9 is connected to the external connection terminal 99 disposed in the MRAM 1 of the present embodiment (refer to FIG. 1). The external voltage is applied to the external connection terminal 99.

In the MRAM 1 of the present embodiment, a read operation for the test operation of the MRAM 1 is started based on the command/control signal from the controller 5 or the test device 9.

Figure 11:
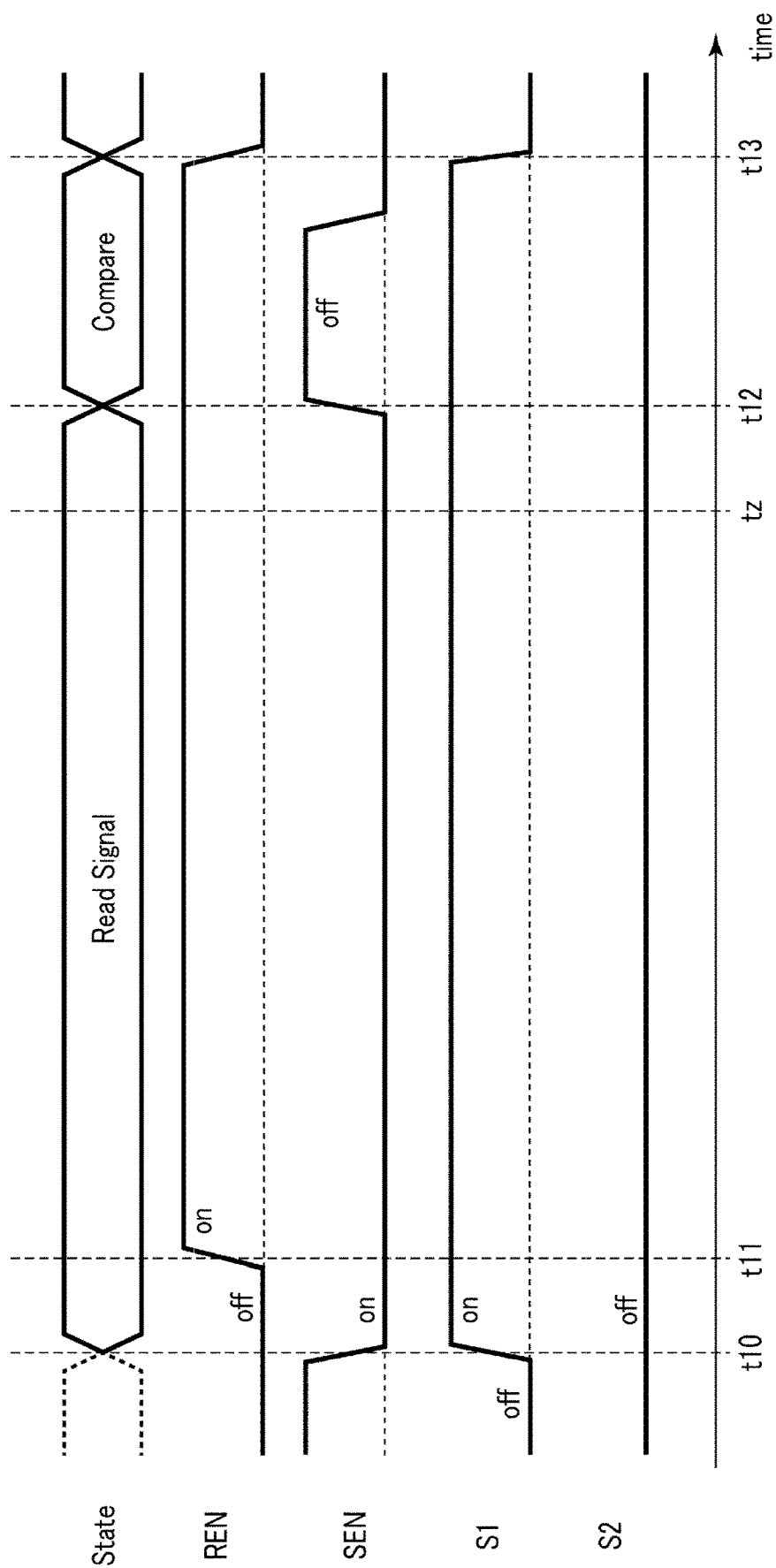
FIGS. 11-12 are diagrams illustrating a second read operation carried out in the memory device of the first embodiment.

FIG. 11 is a timing chart for describing the second read operation of the MRAM of the present embodiment.

By substantially the same control as the first read operation, the control circuit 19 activates the selected cell MCk that holds data to be stored (user data).

At time t10, the control circuit 19 sets the switch S1 to be in the ON state. Accordingly, the capacitance element C1 is connected to the node ND3. The switch S2 is set to be in the OFF state.

At time t11, the control circuit 19 transitions the signal level of the read enable signal REN to the "H" level from the "L" level. The signal at the "H" level sets the transistor Q4 to be in the ON state. The read current IRD flows in the selected cell MCk. Accordingly, the capacitance element C1 is charged depending on the current Ix flowing in the node ND3.

Figure 12:
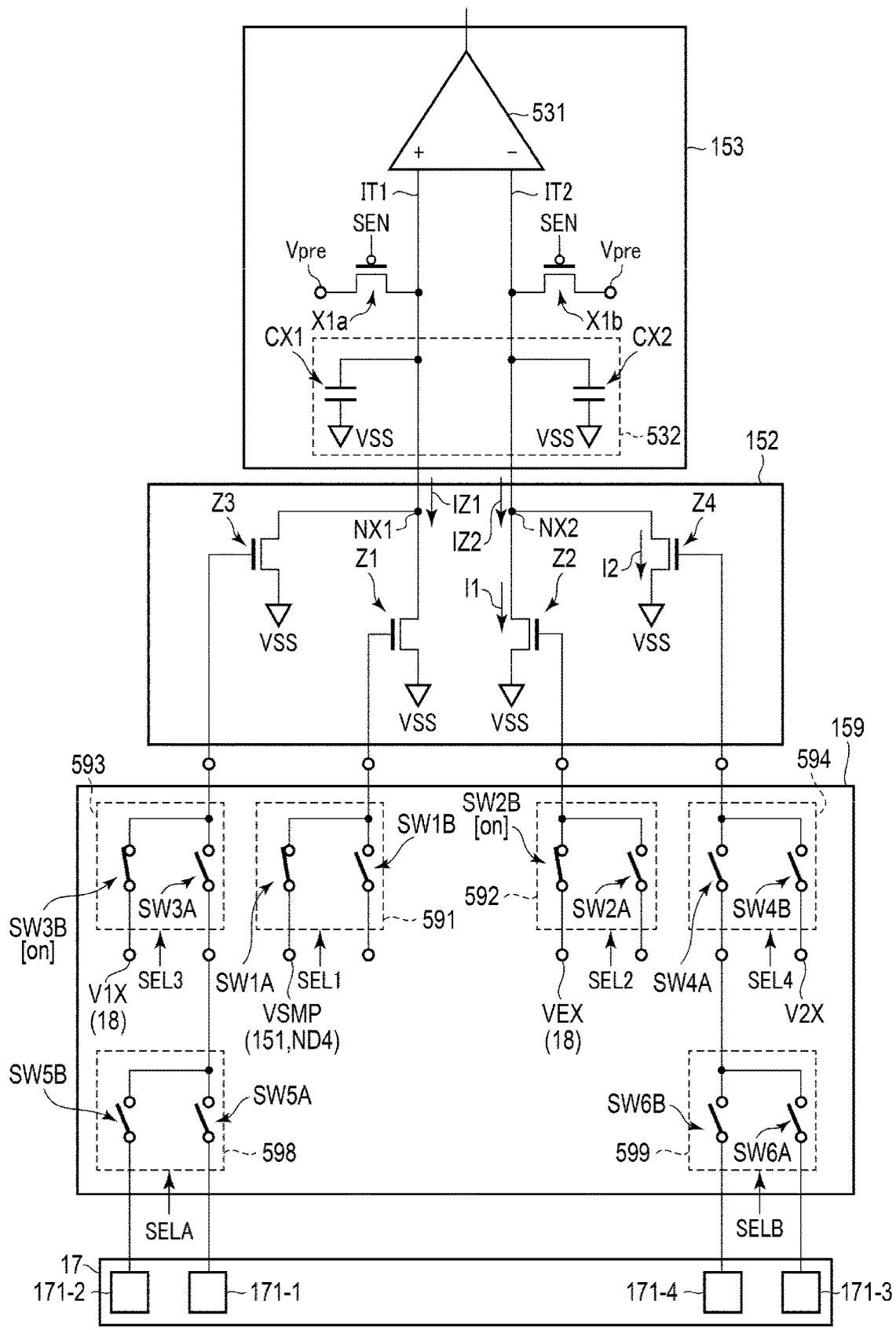

After an elapse of a certain period from the supply of the read current IRD to the selected cell MCk, at time tz, the control circuit 19 supplies a voltage for the test operation to the second sense amplifier circuit 153 by controlling the selection circuit 159 as illustrated in FIG. 12.

FIG. 12 is a schematic diagram illustrating the voltage supplied to the second sense amplifier circuit at time tz in the read operation of the MRAM of the present embodiment.

At time tz, the control circuit 19 sets the switch SW1A to be in the ON state using the control signal SEL1. The switch SW1B is set to be in the OFF state. Accordingly, the electric potential of the capacitance element C1 is applied to the gate of the transistor Z1. A current IZ1 is caused to flow in the node NX1 by the transistor Z1.

At the time of the test operation (for example, screening of the memory cell) for the memory cell array, the test controller 900 of the test device 9 controls ON/OFF of the switches SWZ and SWS as follows to supply a voltage to the external voltage supply circuit 18. The test controller 900 sets the switches SWZ1 and SWS1 to be in the OFF state. The voltages VZ1 and VSS1 are not applied to the voltage output circuit 199-1 due to SWZ1 and SWS1 in the OFF state.

The test controller 900 sets the switch SWZ2 and the switch SWS2 to be in the ON state. The voltage VZ1 is connected to the terminal 99-2 of the voltage output circuit 199-2 through the switch SWZ2 in the ON state. The voltage VSS2 is electrically connected to the terminal 98-2 of the voltage output circuit 199-2 through the switch SWS2 in the ON state. In such a manner, the impedance state of the voltage output circuit 199-2 set to a low impedance state. In the voltage output circuit 199-2 in the low impedance state, a current flows between the terminal 99-2 and the terminal 98-2.

The voltage output circuit 199-2 outputs the voltage VEX. The voltage value of the voltage VEX corresponds to the resistance ratio RR2 set for the voltage output circuit 199-2.

In addition, the test controller 900 sets the switches SWZ3 and SWS3 to be in the ON state. The voltage VZ3 and the voltage VSS3 are applied to the voltage output circuit 199-3. Accordingly, in the voltage output circuit 199-3 in the low impedance state, a current flows between the terminal 99-3 and the terminal 98-3.

The voltage output circuit 199-3 outputs the voltage V2X. The voltage value of the voltage V2X corresponds to the resistance ratio RR3 set for the voltage output circuit 199-3.

The test controller 900 sets the switches SWZ4 and SWS4 to be in the ON state. The voltage VZ4 and the voltage VSS4 are applied to the voltage output circuit 199-4. Accordingly, in the voltage output circuit 199-4 in the low impedance state, a current flows between the terminal 99-4 and the terminal 98-4.

The voltage output circuit 199-4 outputs the voltage V2X. The voltage value of the voltage V2X corresponds to the resistance ratio RR4 set for the voltage output circuit 199-4.

The control circuit 19 electrically connects the external voltage supply circuit 18 to the read circuit 15 at the time of the test operation for the memory cell array 10.

At the time of the test operation, the control circuit 19 controls ON/OFF of the switches of the selection circuit 159 as follows.

At time tz, the control circuit 19 sets the switch SW2B to be in the ON state and sets the switch SW2A to be in the OFF state using the control signal SEL2. Accordingly, the external voltage supply circuit 18 is connected to the gate of the transistor Z2.

The control circuit 19 sets the switch SW3A to be in the OFF state and sets the switch SW3B to be in the ON state using the control signal SEL3.

Accordingly, the external voltage supply circuit 18 is connected to the gate of the transistor Z3. The voltage V1x that is generated from the voltage VZ3 from the outside of the MRAM 1 (the outside of the MRAM chip) is applied to the gate of the transistor Z3 from the external voltage supply circuit 18 through the switch SW3B in the ON state. For example, the switch SW5A and the switch SW5B are set to be in the OFF state.

In the second read operation of the MRAM 1 of the present embodiment, the voltage VEX that is generated from the voltage VZ2 from the outside of the MRAM 1 is applied to the gate of the transistor Z2 from the external voltage supply circuit 18 through the switch SW2B in the ON state.

In addition, the voltage (offset voltage) V2X that is based on the voltage VZ3 from the outside is applied to the gate of the transistor Z4 from the external voltage supply circuit 18.

In the present example, a current IZ2 flows in the node NX2. The current value of the current IZ2 is has a value of the total of the current value of a current I1 of the transistor Z2 and the current value of a current I2 of the transistor Z4.

At time t12 after time tz, the control circuit 19 transitions the signal level of the sense enable signal SEN to the "H" level from the "L" level. Accordingly, the transistor X1 in the OFF state electrically isolates the input terminals IT1 and IT2 of the comparison circuit 531 from the voltage terminal Vpre.

As described above, the difference between the electric potential of the capacitance element CX1 and the electric potential of the capacitance element CX2 is increased along with an elapse of time.

In the same manner as the first read operation, the comparison circuit 531 compares the electric potential of the capacitance element CX1 with the electric potential of the capacitance element CX2.

Consequently, the magnitude of the cell signal of the selected cell MCk is compared with the reference value that is generated using the voltages VEX and V2X from the outside of the MRAM 1.

The control circuit 19 transmits the comparison result of the comparison circuit 531 to the controller 5 or the test device 9. Based on the transmitted comparison result, the characteristics of the memory cell (for example, the resistance value of the MTJ element) and/or success/failure of the memory cell is determined by the controller 5 or the test device 9. The switch S2 in the preamplifier circuit 151 is maintained in the OFF state at the time of the test operation.

In such a manner, the second read operation of the MRAM of the present embodiment is used in the test step such as at the time of screening before the shipment of the MRAM or at the time of the return of the MRAM after the shipment.

Accordingly, the MRAM of the present embodiment can execute the test operation (e.g., to detect a failed memory cell) having relatively high reliability even when the difference between the signal value based on a cell current acquired by the preamplifier circuit at the time of the read operation and the signal value based on a reference current is small.

In the second read operation of the MRAM 1 of the present embodiment, the voltage V2X does not need to be supplied to the gate of the transistor Z4. Instead, the voltage V2A or the voltage V2B may be supplied to the gate of the transistor Z4. In addition, in the second read operation, the voltage V1X, the voltage V1A, or the voltage V1B may be supplied to the gate of the transistor Z3.

The voltage output circuits 199-3 and 199-4 and the external connection terminals 99-3 and 99-4 for the fine adjustment may be connected in common to the switch circuit 598 and the switch circuit 599 when the voltage output circuits 199 are configured not to be used at the same time. In the first and second read operations, the voltage output circuit 199-3 is shared. Consequently, the number of voltage output circuits 199 and the number of external connection terminals 99 in the MRAM 1 are reduced.

The MRAM of the present embodiment may execute the second read operation at the time of reading data in response to a request from the host device, provided that a voltage is provided to the MRAM from the external connection terminal 99.

The external voltage supply circuit 18 disposed in the MRAM 1 of the present embodiment may not be used at the time of the test operation depending on the type of test operation executed for the MRAM of the present embodiment and/or whether or not a voltage for the test operation is supplied.

(c) Conclusion

In the memory device of the present embodiment, the read circuit includes the first sense amplifier circuit and the second sense amplifier circuit.

The memory device of the present embodiment executes the read operation based on the self-reference method (for example, a data destruction type self-reference method).

Figure 13:
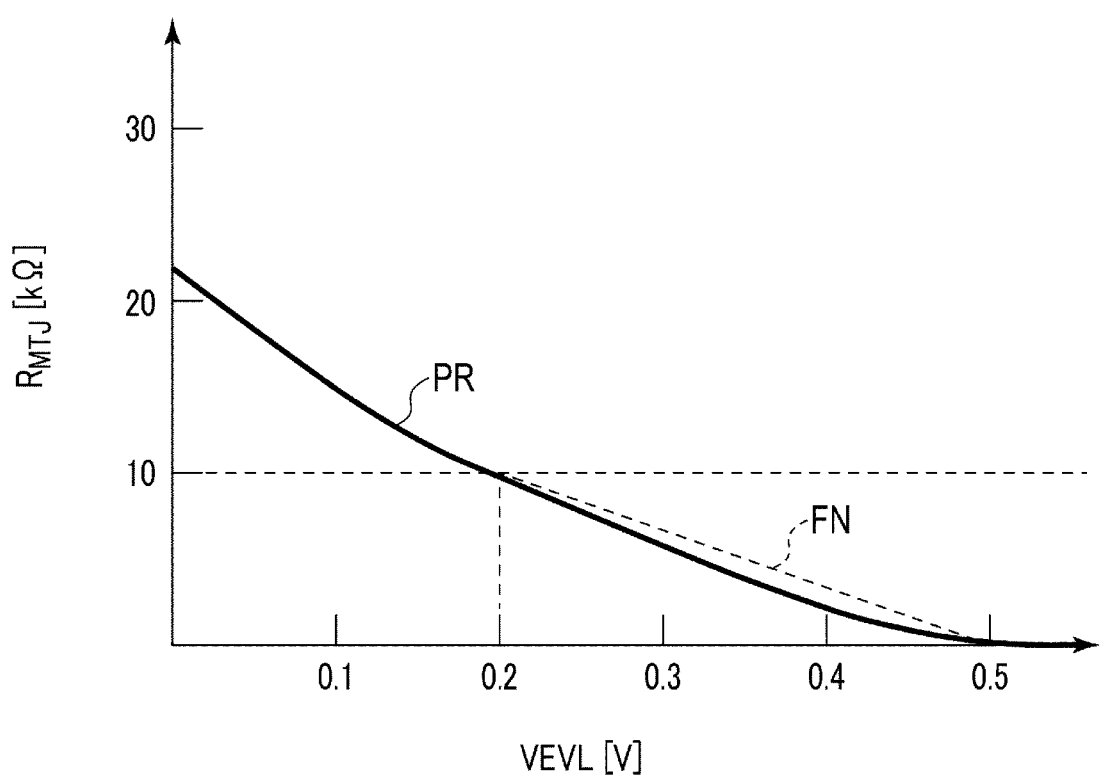
FIG. 13 is a diagram illustrating a relationship between the resistance value of an element in the memory device of the first embodiment and voltage.

FIG. 13 is a graph illustrating a relationship between the resistance value of the MTJ element and a voltage. In FIG. 13, the horizontal axis of the graph corresponds to a voltage VEVL (unit: V), and the vertical axis of the graph corresponds to a resistance value $R_{MTJ}$ (unit: kΩ) of the MTJ element.

The voltage VEVL corresponds to the reference value in the self-reference read method. For example, the voltage value of the voltage VEVL is equal to a voltage that is acquired depending on the output of the MTJ element (selected cell MCk) at the time of reading the reference data.

In FIG. 13, as illustrated by line PR, the voltage VEVL is increased as the resistance value of the resistance value $R_{MTJ}$ of the MTJ element is decreased.

When a difference of 1Ω in the resistance value $R_{MTJ}$ of the MTJ element is differentiated based on a linear approximation function FN of the line PR, it is desirable to control the voltage value of the applied voltage with accuracy of approximately $3 \times 10^{-5}$ V.

In addition, variation in characteristics may occur among a plurality of sense amplifier circuits disposed in the MRAM.

Thus, in the present embodiment, the external voltage supply circuit 18 for generating the reference value/offset value is disposed in the MRAM in order to improve the resolution of application of the voltage to the read circuit 15 (in particular, the sense amplifier circuit 153).

At the time of the read operation of the memory device of the present embodiment, the read circuit can acquire the cell signal and the reference signal from the selected cell and read the data of the selected cell.

The memory device of the present embodiment can achieve reading of data having relatively high reliability by performing the read operation based on the self-reference method.

At the time of the test operation (test step), the output signal of the memory cell of the memory device of the present embodiment can be tested using the reference signal/offset signal (reference voltage/offset voltage) that is generated by the external voltage supply circuit using the external voltage.

The memory device of the present embodiment can be tested with relatively high accuracy by performing the test operation based on the external voltage.

Therefore, the memory device of the first embodiment can provide a memory device having high reliability.

(2) Second Embodiment

A memory device of a second embodiment will be described with reference to FIG. 14.

In the present embodiment, an adjustment method (also referred to as adjustment operation) for the offset voltage of the read circuit will be described.

Figure 14:
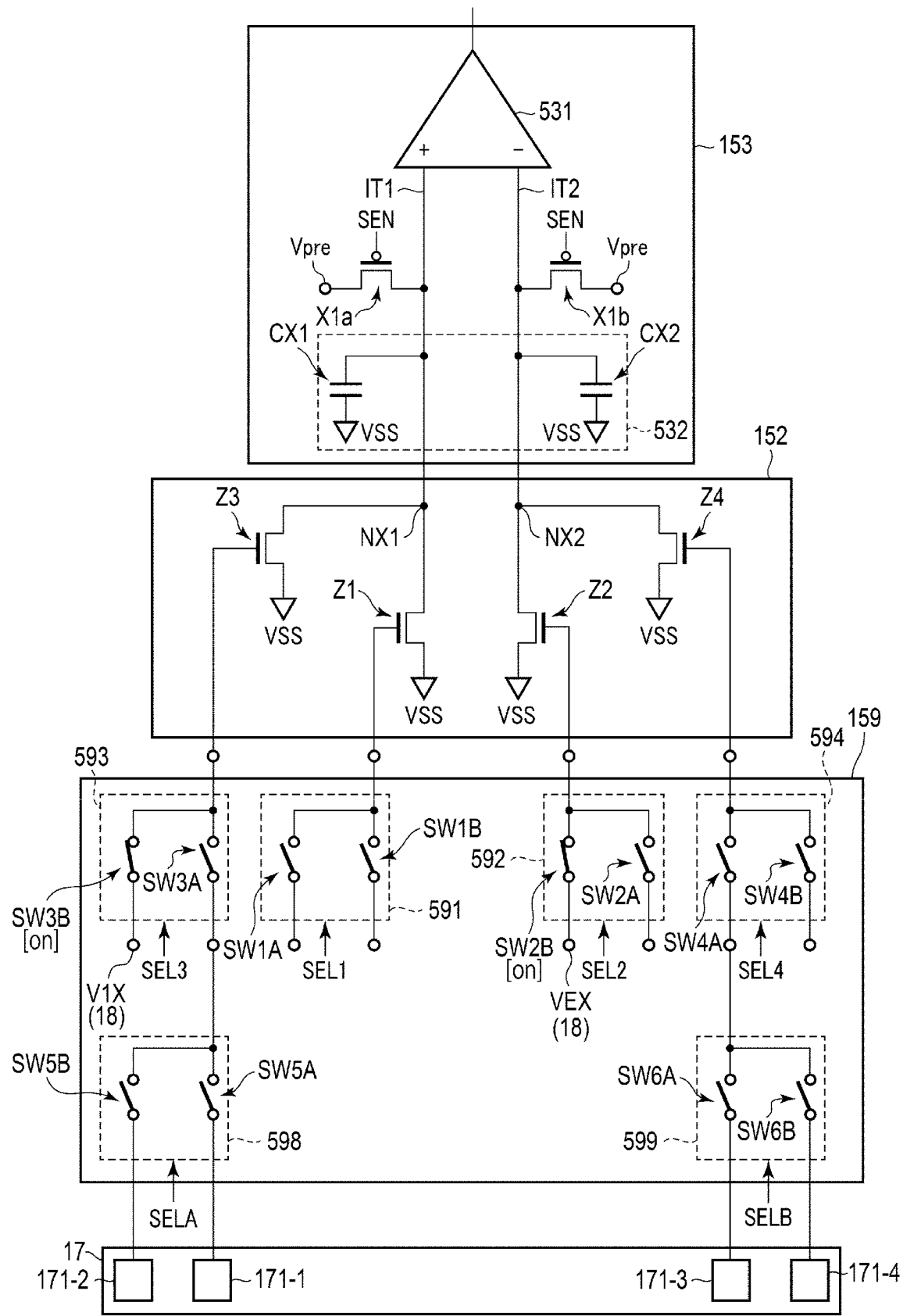
FIG. 14 is a diagram illustrating a read circuit in a memory device of a second embodiment.

FIG. 14 is a schematic diagram for describing the adjustment operation of the read circuit of the memory device (for example, an MRAM) of the present embodiment.

In the present embodiment, in the same manner as the read operation (for example, the read operation of the MRAM based on the self-reference method) of the above memory device (refer to FIG. 7 to FIG. 12), the read current IRD and the current Ix are supplied to the selected cell MCk and the preamplifier circuit 151.

Then, at the time of the adjustment operation of the read circuit of the MRAM of the present embodiment, the control circuit 19 transitions the signal level of the read enable signal REN to the "L" level from the "H" level.

Accordingly, the state of the transistor Q4 is switched to the OFF state from the ON state.

The transistor Q4 in the OFF state stops the supply of the read current to the selected cell MCk. For example, at the time of the adjustment operation of the read circuit, the switches S1 and S2 are set to be in the OFF state.

As illustrated in FIG. 14, the control circuit 19 sets the switch SW2B to be in the ON state using the control signal SEL2. At this point, the switch SW2A is set to be in the OFF state. The voltage VEX is applied to the gate of the transistor Z2. The voltage VEX is a voltage generated from the voltage VZ2 that is applied to the external connection terminal 99-2 by the external voltage supply circuit 18.

At this point, in the test device 9 in FIG. 8, the test controller 900 sets the switch SWZ2 and the switch SWS2 to be in the ON state. The voltage VZ2 is connected to the terminal 99-2 of the voltage output circuit 199-2 through the switch SWZ2. The voltage VSS2 is electrically connected to the terminal 98-2 of the voltage output circuit 199-2 through the switch SWS2 in the ON state. In the voltage output circuit 199-2 in the low impedance state, a current flows between the terminal 99-2 and the terminal 98-2. The voltage output circuit 199-2 outputs the voltage VEX. The voltage value of the voltage VEX corresponds to the resistance ratio RR2 set for the voltage output circuit 199-2.

In such a manner, the voltage VEX is supplied to the switch SW2B.

In the same manner as the first embodiment, the test controller 900 sets the switches SWZ3 and SWS3 to be in the ON state. Accordingly, the voltage V1X is supplied to the switch SW3B.

The control circuit 19 sets the switch SW2B to be in the ON state using the control signal SEL2. The switch SW2A is set to be in the OFF state. Accordingly, the voltage VEX is applied to the gate of the transistor Z2.

The control circuit 19 sets the switch SW3B to be in the ON state using the control signal SEL3. The switches SW3A, SW5A, and SW5B are set to be in the OFF state. The voltage V1X is applied to the gate of the transistor Z3.

The switches SWZ1, SWZ4, SWS1, and SWS4 are set to be in the OFF state by the test controller 900. Accordingly, the voltages VZ1, VZ4, VSS1, and VSS4 of the test device 9 are not applied to the voltage output circuits 199-1 and 199-4. In addition, the control circuit 19 sets the switches SW1A, SW1B, SW4A, SW4B, SW5A, SW5B, SW6A, and SW6B to be in the OFF state. Accordingly, voltages are not applied to the gates of the transistors Z1 and Z4.

For example, the test controller 900 controls the voltage value of the voltage VZ2 applied to the external connection terminal 99-2 and the voltage value of the voltage VZ3 applied to the external connection terminal 99-3. Consequently, the voltage value of the voltage VEX and the voltage value of the voltage V1X are determined.

By controlling the voltage values of the voltages VZ2 and VZ3 (when it is assumed that the voltages VSS2 and VSS3 are equal to 0 V), an operating point at which the output of the second sense amplifier circuit 153 is switched to the "H" level from the "L" level, and an operating point at which the output of the second sense amplifier circuit 153 is switched to the "L" level from the "H" level are tested.

In the external voltage supply circuit 18, the resistance ratio is set such that the output voltage of the voltage output circuit 199-3 becomes equal to 1/10 of the output voltage of the voltage output circuit 199-2 (199-1). Thus, the point of switching between the "L" level and the "H" level of the output of the second sense amplifier circuit 153 is a point at which the value of the voltage VEX and the value of the voltage V1X are balanced.

Accordingly, the voltages VEX and V1X (voltages VZ2 and VZ3) are set such that a desired ratio (for example, the voltage V1X is approximately 1/10 of the voltage VEX) of the output (the voltage value of the voltage VEX) of the voltage output circuit 199-2 to the output (the voltage value of the voltage V1X) of the voltage output circuit 199-3 is achieved. Consequently, the voltage used in the test of the MRAM is adjusted.

Similarly, the voltage values of the voltage VEX and the voltage V1X can be set based on the test result for the operating point of switching of the signal level of the second sense amplifier circuit using the external voltage.

As described thus far, various voltages used in the MRAM of the present embodiment may be adjusted.

Therefore, the memory device of the second embodiment can improve the reliability of the memory.

(3) Third Embodiment

A memory device of a third embodiment will be described with reference to FIG. 15.

In the memory device of the present embodiment, the voltage supplied to the read circuit from the external voltage supply circuit may be adjusted as follows.

Figure 15:
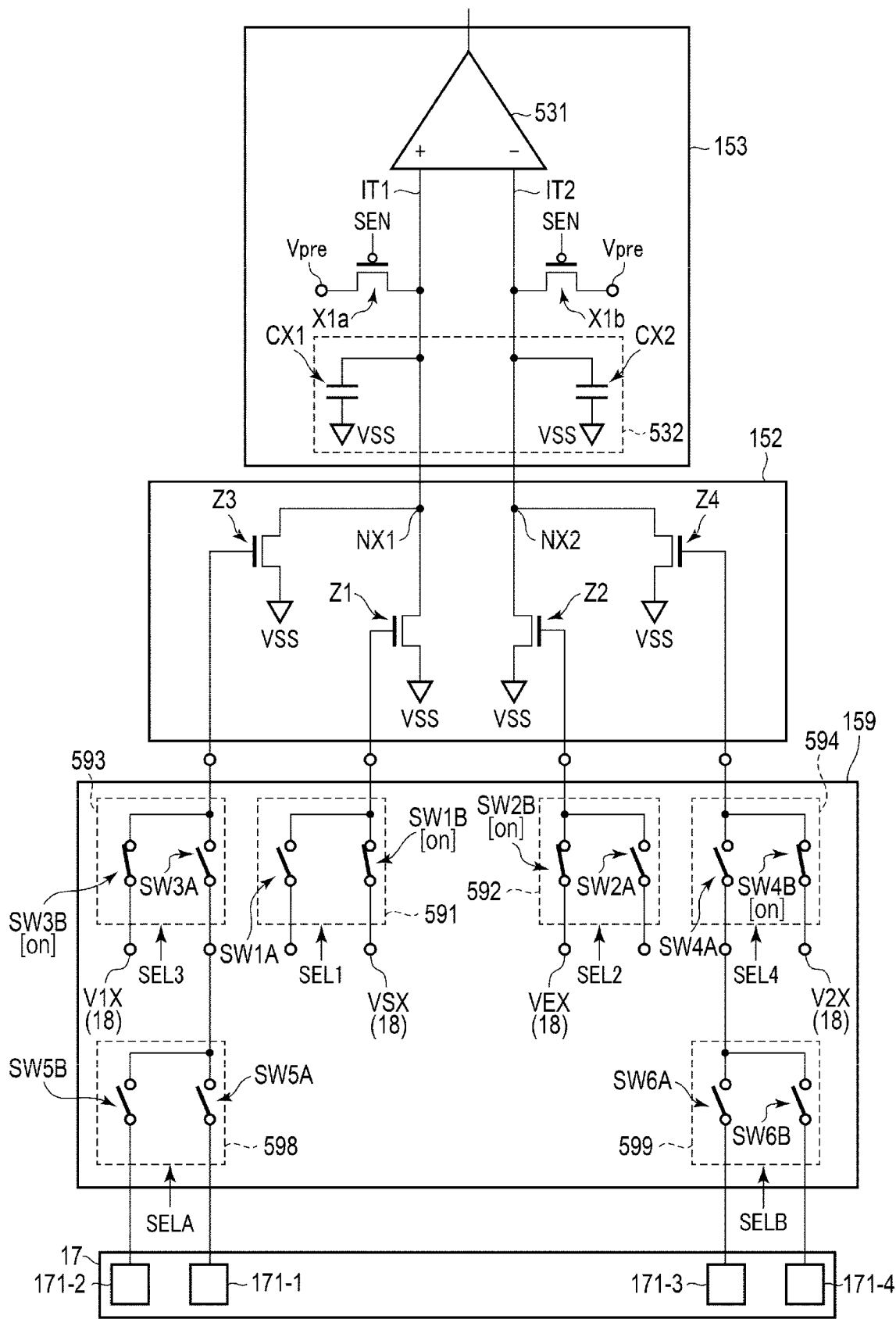
FIG. 15 is a diagram illustrating a read circuit in a memory device of a third embodiment.

FIG. 15 is a schematic diagram for describing an adjustment operation for the voltage supplied to the read circuit from the external voltage supply circuit of the memory device (for example, an MRAM) of the present embodiment.

As illustrated in FIG. 15, at the time of adjusting the voltage (for example, an offset voltage) supplied to the read circuit 15 from the external voltage supply circuit 18, the transistors Z1, Z2, Z3, and Z4 in the conversion circuit 152 are driven using the external voltage VZ. For example, in a state where the read circuit 15 is activated, the memory cell MC is electrically isolated from the read circuit 15.

The control circuit 19 sets the switch SW1B to be in the ON state using the control signal SEL1. Accordingly, the external connection terminals 98-1 and 99-1 are electrically connected to the gate of the transistor Z1 through the voltage output circuit 199-1 and the switch SW1B in the ON state.

The control circuit 19 sets the switch SW2B to be in the ON state using the control signal SEL2. Accordingly, the external connection terminals 98-2 and 99-2 are electrically connected to the gate of the transistor Z2 through the voltage output circuit 199-2 and the switch SW2B in the ON state.

The control circuit 19 sets the switch SW3B to be in the ON state using the control signal SEL3. The switches SW3A, SW5A, and SW5B are set to be in the OFF state. Accordingly, the external connection terminals 98-3 and 99-3 are electrically connected to the gate of the transistor Z3 through the voltage output circuit 199-3 and the switch SW3B in the ON state.

The control circuit 19 sets the switch SW4B to be in the ON state using the control signal SEL4. The switches SW4A, SW6A, and SW6B are set to be in the OFF state. Accordingly, the external connection terminals 98-4 and 99-4 are electrically connected to the gate of the transistor Z4 through the voltage output circuit 199-4 and the switch SW4B in the ON state.

The test device 9 applies the external voltages VZ1, VZ2, VZ3, and VZ4 to the external connection terminals 99-1, 99-2, 99-3, and 99-4 through the switches SWZ1, SWZ2, SWZ3, and SWZ4 in the ON state. The test device 9 applies the external ground voltages VSS1, VSS2, VSS3, and VSS4 to the external connection terminals 98-1, 98-2, 98-3, and 98-4 through the switches SWS1, SWS2, SWS3, and SWS4 in the ON state.

In a state where the second sense amplifier circuit 153 is operated using the external voltages VZ1 to VZ4, the slope of change (the slope of change to the "L" level from the "H" level and/or the slope of change to the "H" level from the "L" level) in the output signal of the second sense amplifier circuit 153 is measured by the test device 9.

The slope of change in the output signal of the MRAM of the present embodiment may be measured by controlling the voltage values of the voltages VZ1 to VZ4 supplied from the outside.

In substantially the same manner as the second embodiment, the offset voltage (the output voltage of the offset voltage generation circuit 171) may be adjusted and controlled in the MRAM of the present embodiment based on the measurement result.

In such a manner, the offset voltage used in the read operation of the MRAM of the present embodiment can be adjusted.

Accordingly, the memory device of the third embodiment can improve the reliability of the memory.

(4) Fourth Embodiment

A memory device of a fourth embodiment will be described with reference to FIG. 16.

Measurement of the voltage supplied to the read circuit from the external voltage supply circuit in the present embodiment will be described. For example, the offset voltage of the read circuit is measured as follows.

Figure 16:
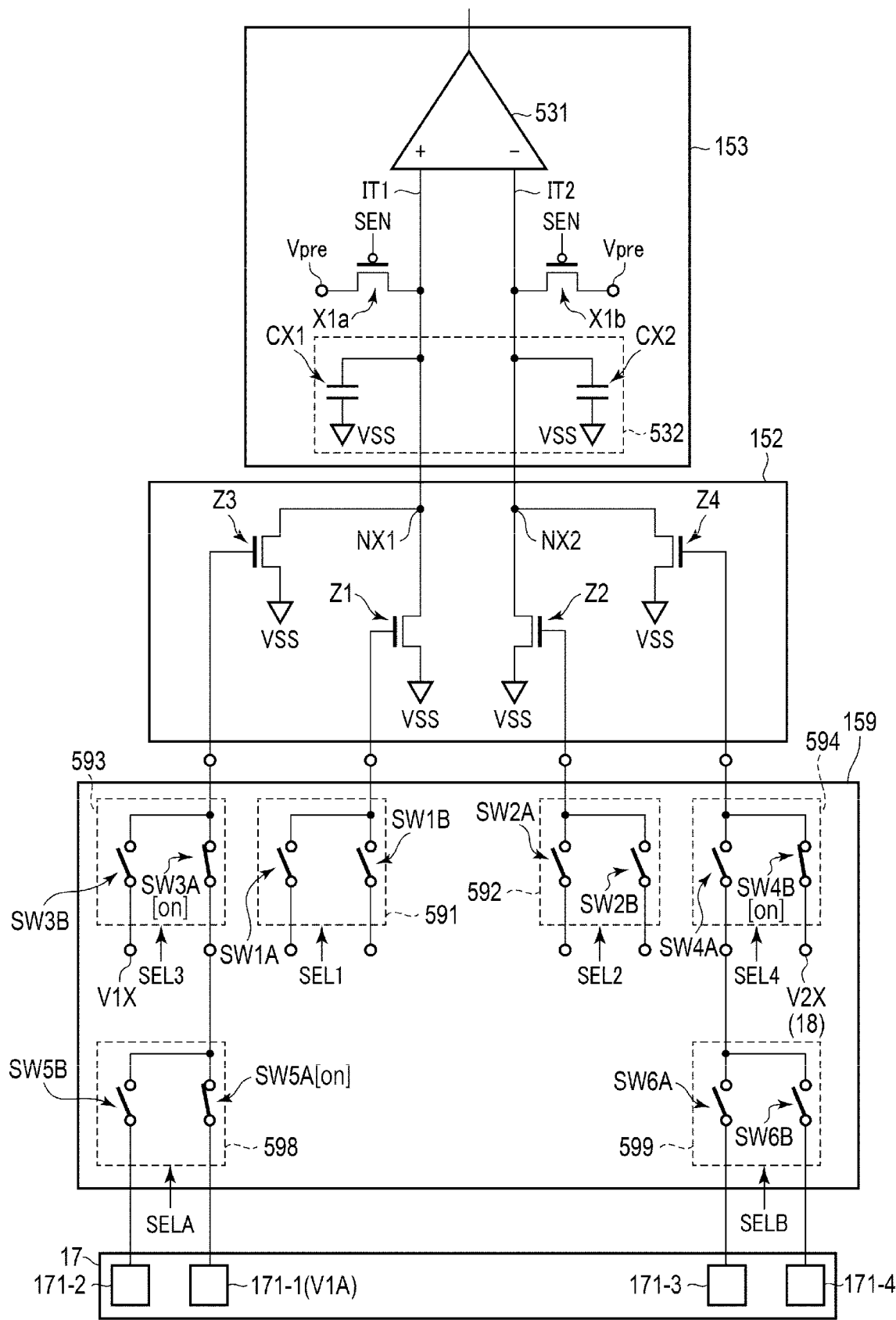
FIG. 16 is a diagram illustrating a read circuit in a memory device of a fourth embodiment.

FIG. 16 is a schematic diagram illustrating one example of a connection status among circuits at the time of measuring the offset voltage in the MRAM of the present embodiment.

In the memory device (for example, an MRAM) of the present embodiment, for example, in the same manner as the second embodiment, the supply of the read current to the selected cell MCk is stopped in a state where the read circuit 15 is activated.

Then, the voltage from the offset voltage generation circuit 171 is applied to anyone of the two offset transistors Z3 and Z4, and the voltage from the external voltage supply circuit 18 is applied to the other transistor.

FIG. 16 illustrates an example in which the offset voltage V1A is applied to the gate of the transistor Z3. The external connection terminals 98-4 and 99-4 are connected to the gate of the transistor Z4 through the voltage output circuit 199-4 and the switch SW4B in the ON state. Accordingly, the voltage V2X is applied to the gate of the transistor Z4.

In such a state, the voltage value of the voltage VZ4 applied to the external connection terminals 98-4 and 99-4 is controlled. Accordingly, the voltage value of the output voltage V2X is adjusted in the voltage output circuit 199-4.

The voltage value (for example, a value of 1/10 of the voltage value of the voltage VZ4) of the voltage V2X when an operating point, at which the displacement of the output of the amplification circuit 532 is balanced, is acquired, corresponds to the voltage value of the offset voltage V1A on the cell signal side.

When the offset voltage on the transistor Z4 side is measured, the voltage value of the voltage V1X applied to the external connection terminal 99-3 is controlled in a state where the voltage from the offset voltage generation circuit 171-4 is applied to the gate of the transistor Z4.

In such a manner, the offset voltage applied to the read circuit of the MRAM of the present embodiment can be measured. Based on the measurement result, the output voltage of the offset voltage generation circuit 171 may be appropriately set.

As described thus far, the memory device of the fourth embodiment can improve the reliability of the memory.

(5) Fifth Embodiment

A memory device of a fifth embodiment will be described with reference to FIG. 17 and FIG. 18.

The internal electric potential of the read circuit of the memory device of the present embodiment can be measured as follows.

Figure 17:
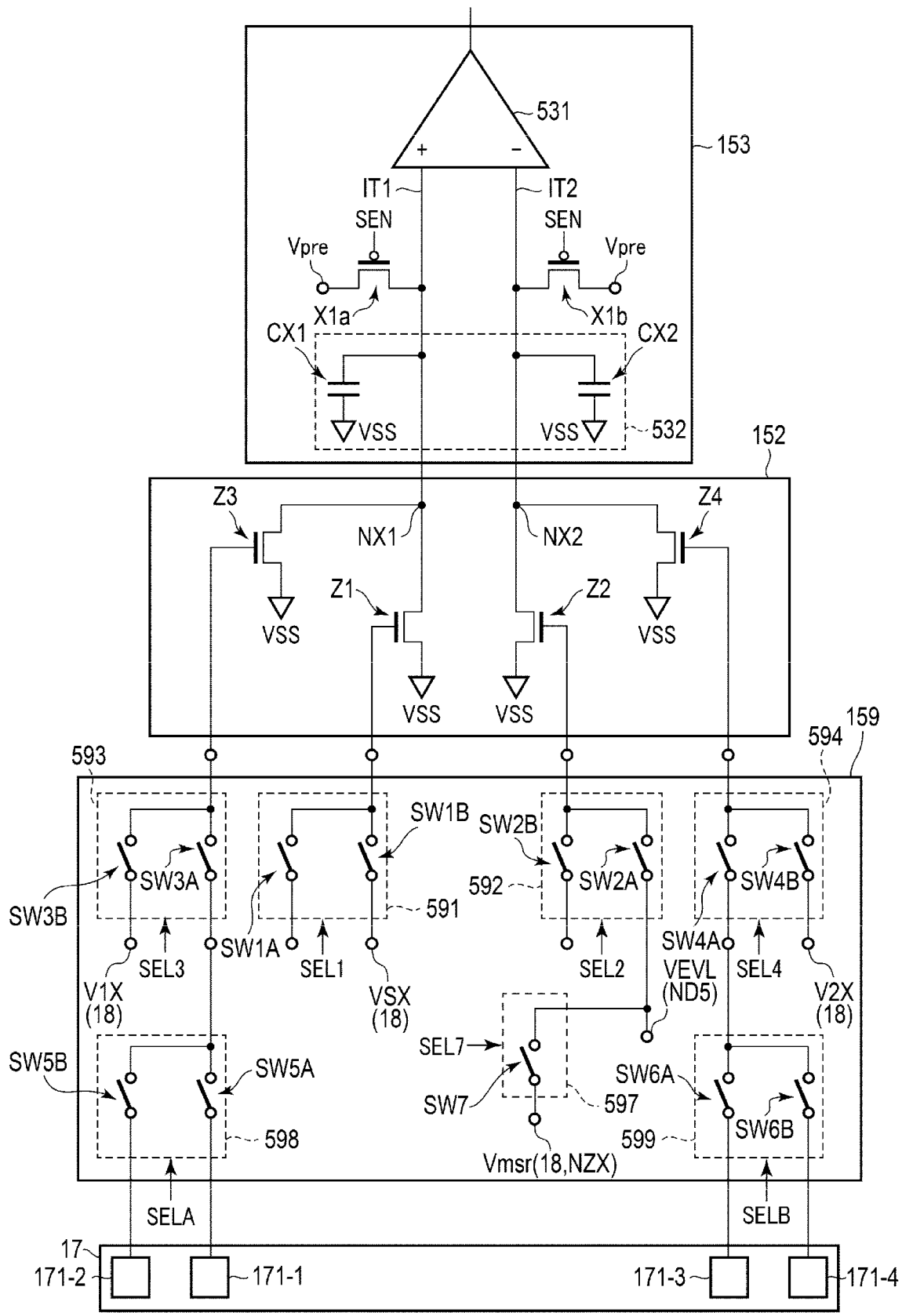
FIG. 17 is a diagram illustrating a read circuit in a memory device of a fifth embodiment.

FIG. 17 is a circuit diagram schematically illustrating a configuration example of the read circuit in the memory device (for example, an MRAM) of the present embodiment.

As illustrated in FIG. 17, in the selection circuit 159, a switch SW7 is disposed in a switch circuit 597. One end of the switch SW7 is electrically connected to the node ND5 in the preamplifier circuit 151. The other end of the switch SW7 is electrically connected to a node NZX of the external voltage supply circuit 18.

A control signal SELC is supplied to the switch circuit 597. The switch SW7 is ON or OFF by the control signal SELC.

A voltage (in particular, the voltage VEVL) generated in the MRAM 1 of the present embodiment is output to the test device 9 through the switch SW7. Accordingly, the test device 9 can directly measure the internal voltage in the MRAM 1.

Figure 18:
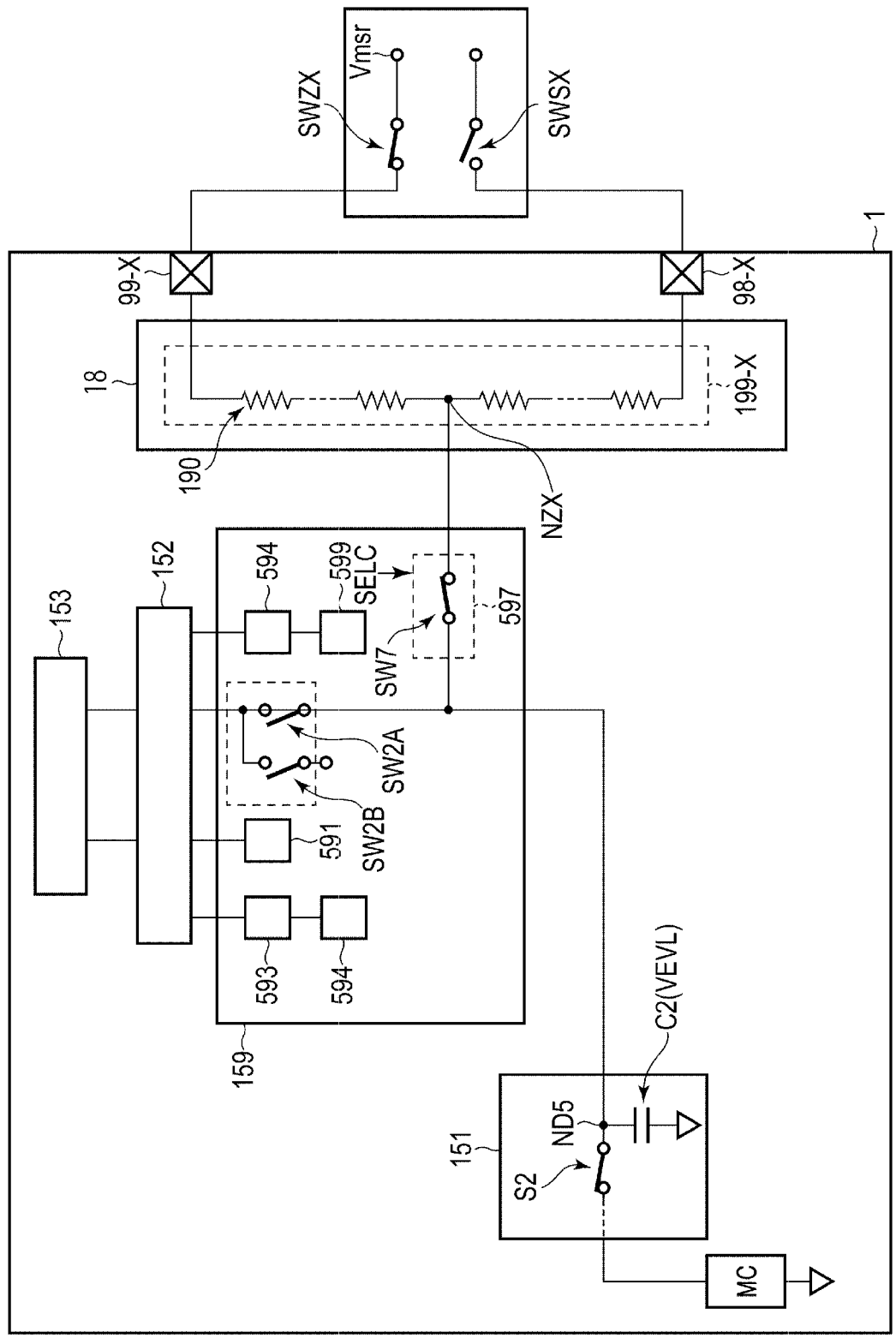
FIG. 18 is a diagram for describing an operation example of the memory device of the fifth embodiment.

FIG. 18 is a schematic diagram for describing a connection relationship between the read circuit and the test device at the time of measuring the internal electric potential of the read circuit in the MRAM of the present embodiment. In FIG. 18, a main part for measuring the voltage in the present embodiment is illustrated for simplification of illustration and description.

In the present embodiment, the test device 9 measures the electric potential of the node ND5 of the preamplifier circuit 151, which corresponds to the electric potential of the capacitance element C2. Variation (e.g., attributable to error) that may occur between the node ND5 and the conversion circuit 152 may be reflected in the result of measurement of the electric potential by the test device 9.

As described above, the capacitance element C2 is charged after the capacitance element C1 is charged. Accordingly, the capacitance element C2 holds the electric potential VEVL.

As illustrated in FIG. 18, the switch SW7 is set to be in the ON state by the control signal SELC. The switches SW2A and SW2B are set to be in the OFF state. In addition, each switch SW of other switch circuits 591, 593, 594, and 598 is set to be in the OFF state. Accordingly, the node ND5 of the preamplifier circuit 151 is connected to the node NZX of a voltage output circuit 199-X of the external voltage supply circuit 18.

In the test device 9, the test controller 900 sets a switch SWZX to be in the ON state and sets a switch SWSX to be in the OFF state. Accordingly, a current does not flow between a terminal 99-X and a terminal 98-X. In the voltage output circuit 199-X, the impedance state between the two external connection terminals 98-X and 99-X is a high impedance state.

The node ND5 is electrically connected to the test device 9 through the selection circuit 159 and the voltage output circuit 199-X in the high impedance state. The electric potential of the node ND5 is output to the test device 9 through the voltage output circuit 199-X. Consequently, the test device 9 can measure the electric potential of the node ND5 as an output voltage Vmsr of the switch SWZ2. For example, an electric potential VEVL of the capacitance element C2 in a voltage application state (during charging) is monitored. During the monitoring of the electric potential VEVL, for example, the switch S2 is maintained in the ON state.

When the capacitance value of the capacitance element C2 is small, it is preferable to set the switches SW7, SWZX, and SWSX to be in the ON state before the charging of the capacitance element C2 is started.

The voltage value of the offset voltage V2X (and/or the voltage value of the voltage VEXC) may be appropriately set based on the measurement result of the voltage Vmsr and the cell signal corresponding to the AP/P state of the MTJ element 100.

The electric potential of the node ND4 of the preamplifier circuit 151 may be measured using substantially the same configuration and substantially the same method as the measurement of the electric potential of the node ND5 described using FIG. 18. Accordingly, the voltage value of the offset voltage V1X may be appropriately set.

The voltage output circuit for measuring the internal voltage (the electric potential of the node ND5) may also be used as the voltage output circuit for voltage adjustment.

In such a manner, the offset voltage applied to the read circuit of the MRAM of the present embodiment can be measured/set.

Therefore, the memory device of the fifth embodiment can improve the reliability of the memory.

(6) Modification Examples

Modification examples of the memory device of the present embodiment will be described with reference to FIG. 19 and FIG. 20.

Modification Example 1

In the above embodiments, the magnetization arrangement state of the MTJ element is set to the P state in order to generate the reference signal in the read operation based on the self-reference method.

The reference signal in the read operation based on the self-reference method may be generated by the MTJ element in the AP state.

After the supply of the read current for the first data read, a write current for writing data of "1" flows in the selected cell MCk in order to set the MTJ element 100 in the selected cell MCk to be in the AP state.

After data of "1" as the reference data is written, the second data read is executed.

Figure 19:
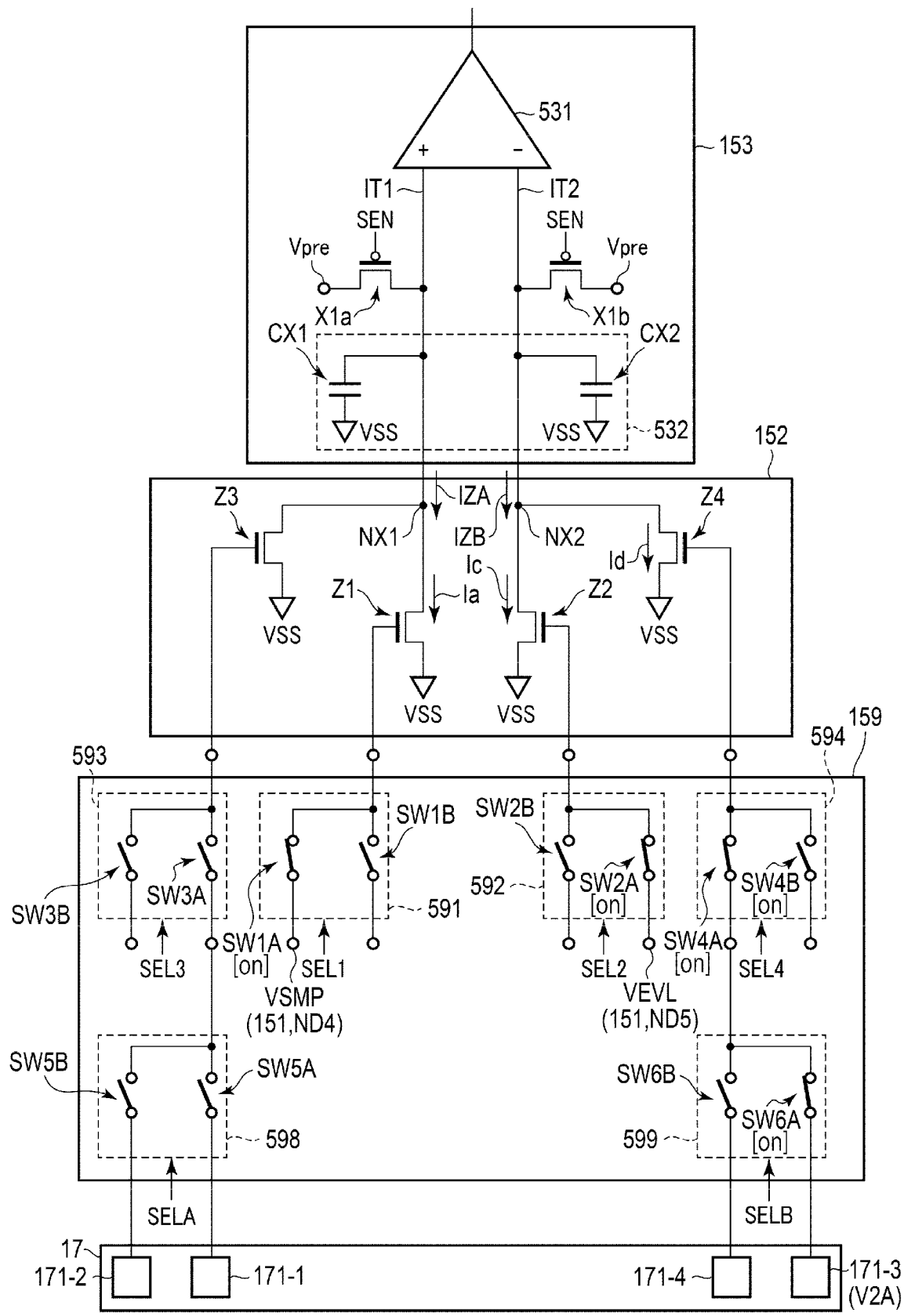
FIG. 19 is a diagram illustrating a read circuit in a first modification example of the memory device of the embodiment.

FIG. 19 is a schematic diagram illustrating a voltage supplied to the second sense amplifier circuit at the time of the second data read in the read operation of the MRAM of the present embodiment.

As illustrated in FIG. 19, for example, when data of "1" is used as the reference data, the offset value is given on the reference value side. The offset value is not given on the cell signal side.

Accordingly, the offset voltage V2A is applied to the gate of the transistor Z4. The transistor Z3 is set to be in the OFF state.

For example, when the current value of the current Ia flowing in the transistor Z1 is less than the sum of the current value of the current Ic flowing in the transistor Z3 and the current value of a current Id flowing in the transistor Z4, the magnetization arrangement state of the MTJ element 100 of the selected cell MCk is the AP state.

For example, when the current value of the current Ia flowing in the transistor Z1 is greater than the sum of the current value of the current Ic flowing in the transistor Z3 and the current value of a current Id flowing in the transistor Z4, the magnetization arrangement state of the MTJ element 100 of the selected cell MCk is the P state.

The offset voltage applied to the gate of the transistor Z4 is set such that such a relationship is achieved between the current IZA flowing in the node NX1 and the current IZB flowing in the node NX2.

Even when the reference data is set to data corresponding to the MTJ element in the AP state as mentioned above, the memory device of the present embodiment can work according to each of the above embodiments.

Modification Example 2

In the MRAM of the present embodiment, the circuit configuration of the second sense amplifier circuit of the read circuit is not limited to the example in FIG. 7.

Figure 20:
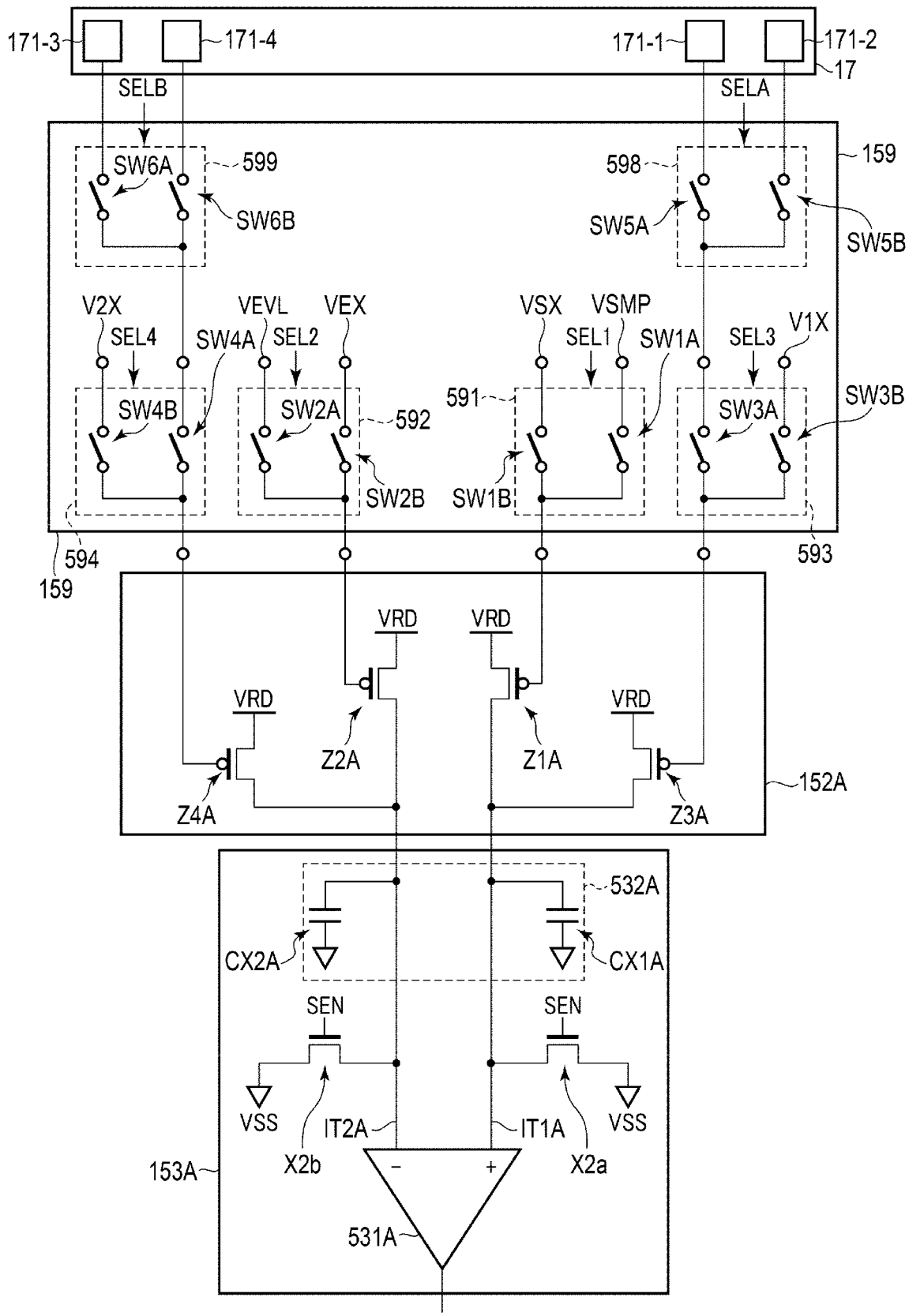
FIG. 20 is a diagram illustrating a read circuit in a second modification example of the memory device of the embodiment.

FIG. 20 is an equivalent circuit diagram illustrating a modification example of the second sense amplifier circuit in the MRAM of the present embodiment.

As illustrated in FIG. 20, a second sense amplifier circuit 153A may be configured such that a current flows from the conversion circuit side (high electric potential side) to the comparison circuit side (low electric potential side).

One end of the current path of an N-type field effect transistor X2a is connected to input terminal IT1A of a comparison circuit 531A, and one end of the current path of an N-type field effect transistor X2b is connected to input terminal IT1B of the comparison circuit 531A. The other ends of the current paths of the transistors X2a, X2b are each connected to the ground terminal VSS. The sense enable signal SEN is supplied to the gate of the transistors X2a, X2b.

In the present example, when the signal level of the sense enable signal SEN is the "H" level, the transistors X2a, X2b are set to be in the ON state. When the signal level of the sense enable signal SEN is the "L" level, the transistors X2a, X2b are set to be in the OFF state.

When sensing of the signal (voltages VSMP and VEVL) from the preamplifier circuit 151 is started, the transistors X2a, X2b are set to be in the ON state. Accordingly, currents flow in the input terminals IT1A and IT2A, and capacitance elements CX1A and CX2A of an amplification circuit 532A are charged.

When the signal from the preamplifier circuit 151 is amplified, the transistors X2a, X2b are set to be in the OFF state. Accordingly, the difference in electric potential between the capacitance element CX1A and the capacitance element CX2A is increased.

The comparison circuit 531A compares the electric potentials of the capacitance elements CX1A and CX2A.

In such a manner, the MRAM of the present modification example can read data from the selected cell and execute the test operation for the memory cell using the second sense amplifier circuit in FIG. 18.

The configurations of the first and second sense amplifier circuits in the read circuit are not limited to FIG. 6, FIG. 7, and FIG. 18 and may be current sensing type sense amplifier circuits or may be voltage sensing type sense amplifier circuits.

(7) Others

An example in which the perpendicular magnetization type magnetoresistive effect element is used as the memory element in the MRAM as the memory device of the present embodiment is described. However, in the present embodiment, the magnetoresistive effect element may be an in-plane magnetization type magnetoresistive effect element.

In the in-plane magnetization type magnetoresistive effect element, the magnetization direction of the magnetic layers (including the storage layer and the reference layer) is substantially parallel to the layer surface of the magnetic layer. In the in-plane magnetization type magnetoresistive effect element, the magnetization direction of the magnetic layer is substantially parallel to the layer surface of the magnetic layer based on the magnetic anisotropy of the magnetic layer as the shape magnetic anisotropy or the like of the magnetic layer. The magnetization direction of the magnetic layer is substantially perpendicular to the stack direction of the magnetic layer.

In the present embodiment, the memory device of the present embodiment is described with an MRAM as an example. The present embodiment may be applied to a memory device other than the MRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell;
a first sense amplifier circuit that is electrically connected to the memory cell;
a second sense amplifier circuit that is electrically connected to the first sense amplifier circuit through a selection circuit; and
a voltage supply circuit that is electrically connected to the second sense amplifier circuit through the selection circuit and includes a first terminal, wherein at a time of performing a read operation on the memory cell, a first signal based on a first output signal of the first sense amplifier circuit corresponding to data stored in the memory cell before writing of reference data therein and a second signal based on a second output signal of the first sense amplifier circuit corresponding to data stored in the memory cell after writing of the reference data therein, are supplied to the second sense amplifier circuit, and the second sense amplifier circuit compares the first and second signals and outputs a comparison result that is representative of the data stored in the memory cell before writing of the reference data therein, and at a time of performing a test operation on the memory cell, a third signal based on the first output signal of the first sense amplifier circuit and a fourth signal based on a first voltage applied to the first terminal are supplied to the second sense amplifier circuit, and the second sense amplifier circuit outputs a comparison result of the third and fourth signals as a test result.

2. The memory device according to claim 1, further comprising:
a conversion circuit that is electrically connected between the selection circuit and the second sense amplifier circuit and that includes a first transistor including a second terminal electrically connected to a first input terminal of the second sense amplifier circuit and a second transistor including a third terminal electrically connected to a second input terminal of the second sense amplifier circuit,
wherein at the time of the read operation, the selection circuit supplies the first output signal to a gate of the first transistor and supplies the second output signal to a gate of the second transistor, and
at the time of the test operation, the selection circuit supplies the first output signal to the gate of the first transistor and supplies a third output signal generated from the first voltage applied to the first terminal to the gate of the second transistor.

3. The memory device according to claim 2,
wherein the voltage supply circuit further includes a first voltage output circuit that is electrically connected between the first terminal and the selection circuit, and
the first voltage output circuit generates the third output signal using the first voltage.

4. The memory device according to claim 3,
wherein the conversion circuit further includes a third transistor including a fourth terminal electrically connected to the first input terminal and a fourth transistor including a fifth terminal electrically connected to the second input terminal,
at the time of the read operation, the selection circuit supplies a fifth signal containing an offset voltage to a gate of the third transistor, and
at the time of the test operation, the selection circuit supplies a sixth signal from the voltage supply circuit to a gate of the fourth transistor.

5. The memory device according to claim 4,
wherein the voltage supply circuit further includes a sixth terminal and a second voltage output circuit that is electrically connected between the sixth terminal and the selection circuit, and
at the time of the test operation, the second voltage output circuit generates the sixth signal using a second voltage applied to the sixth terminal, and the selection circuit supplies the sixth signal to at least one of the gate of the third transistor and the gate of the fourth transistor.

6. The memory device according to claim 1, further comprising:
an offset voltage generation circuit configured to generate an offset voltage that adjusts either the first signal or the second signal at the time of the read operation.

7. The memory device according to claim 1, wherein the memory cell is a magnetoresistive effect element comprising two magnetic layers, one of which has a variable magnetization direction and the other of which has a fixed magnetization direction, and a non-magnetic layer between the two magnetic layers.

8. A magnetic random access memory, comprising:
a memory cell comprising two magnetic layers, one of which has a variable magnetization direction and the other of which has a fixed magnetization direction, and a non-magnetic layer between the two magnetic layers;
a read circuit configured to read data stored in the memory cell, the read circuit including a first sense amplifier circuit and a second sense amplifier circuit;
a write circuit configured to write data into the memory cell;
a control circuit configured to control the read circuit and the write circuit during a read operation performed on the memory cell; and
a voltage supply circuit that is electrically connected to the read circuit and configured to supply a first voltage to the second sense amplifier circuit through a first terminal, wherein
at a time of performing a read operation on the memory cell, a first signal based on a first output signal of the first sense amplifier circuit corresponding to data stored in the memory cell before writing of reference data therein and a second signal based on a second output signal of the first sense amplifier circuit corresponding to data stored in the memory cell after writing of the reference data therein, are supplied to the second sense amplifier circuit, and the second sense amplifier circuit compares the first and second signals and outputs a comparison result that is representative of the data stored in the memory cell before writing of the reference data therein, and
at a time of performing a test operation on the memory cell, a third signal based on the first output signal of the first sense amplifier circuit and a fourth signal based on a first voltage applied to the first terminal are supplied to the second sense amplifier circuit, and the second sense amplifier circuit outputs a comparison result of the third and fourth signals as a test result.

9. The magnetic random access memory according to claim 8, further comprising:
a conversion circuit that is electrically connected between the first sense amplifier circuit and the second sense amplifier circuit and that includes a first transistor including a second terminal electrically connected to a first input terminal of the second sense amplifier circuit and a second transistor including a third terminal electrically connected to a second input terminal of the second sense amplifier circuit,
wherein at the time of the read operation, the first output signal is supplied to a gate of the first transistor and the second output signal is supplied to a gate of the second transistor, and
at the time of the test operation, the first output signal is supplied to the gate of the first transistor and a third output signal generated from the first voltage applied to the first terminal is supplied to the gate of the second transistor.

10. The magnetic random access memory according to claim 9,
wherein the voltage supply circuit further includes a first voltage output circuit that is electrically connected between the first terminal and the second sense amplifier circuit, and
the first voltage output circuit generates the third output signal using the first voltage.

11. The magnetic random access memory according to claim 10,
wherein the conversion circuit further includes a third transistor including a fourth terminal electrically connected to the first input terminal and a fourth transistor including a fifth terminal electrically connected to the second input terminal,
at the time of the read operation, a fifth signal containing an offset voltage is supplied to a gate of the third transistor, and
at the time of the test operation, a sixth signal from the voltage supply circuit is supplied to a gate of the fourth transistor.

12. The magnetic random access memory according to claim 11,
wherein the voltage supply circuit further includes a sixth terminal and a second voltage output circuit that is electrically connected between the sixth terminal and the second sense amplifier circuit, and
at the time of the test operation, the second voltage output circuit generates the sixth signal using a second voltage applied to the sixth terminal, and the sixth signal is supplied to at least one of the gate of the third transistor and the gate of the fourth transistor.

13. The magnetic random access memory according to claim 8, further comprising:
an offset voltage generation circuit configured to generate an offset voltage that adjusts either the first signal or the second signal at the time of the read operation.

14. A method of performing a read operation and a test operation in a memory device that includes a memory cell, a first sense amplifier circuit that is electrically connected to the memory cell, a second sense amplifier circuit that is electrically connected to the first sense amplifier circuit through a selection circuit, and a voltage supply circuit that is electrically connected to the second sense amplifier circuit through the selection circuit and includes a first terminal, said method comprising:
at a time of performing the read operation on the memory cell,
generating a first signal based on a first output signal of the first sense amplifier circuit corresponding to data stored in the memory cell before writing of reference data therein and a second signal based on a second output signal of the first sense amplifier circuit corresponding to data stored in the memory cell after writing of the reference data therein, and
comparing the first and second signals at the second sense amplifier circuit and outputting a comparison result that is representative of the data stored in the memory cell before writing of the reference data therein, and
at a time of performing a test operation on the memory cell,
generating a third signal based on the first output signal of the first sense amplifier circuit and a fourth signal based on a first voltage applied to the first terminal, and
comparing the third and fourth signals and outputting a comparison result as a test result.

15. The method of claim 14, wherein
the memory device further includes a conversion circuit that is electrically connected between the selection circuit and the second sense amplifier circuit and that includes a first transistor including a second terminal electrically connected to a first input terminal of the second sense amplifier circuit and a second transistor including a third terminal electrically connected to a second input terminal of the second sense amplifier circuit, and wherein said method further comprises:
at the time of the read operation, supplying the first output signal to a gate of the first transistor and the second output signal to a gate of the second transistor; and
at the time of the test operation, supplying the first output signal to the gate of the first transistor and a third output signal generated from the first voltage applied to the first terminal to the gate of the second transistor.

16. The method according to claim 15, wherein
the voltage supply circuit further includes a first voltage output circuit that is electrically connected between the first terminal and the selection circuit, and said method further comprises:
generating with the first voltage output circuit, the third output signal using the first voltage.

17. The method according to claim 16, wherein
the conversion circuit further includes a third transistor including a fourth terminal electrically connected to the first input terminal and a fourth transistor including a fifth terminal electrically connected to the second input terminal, and said method further comprises:
at the time of the read operation, supplying a fifth signal containing an offset voltage to a gate of the third transistor; and
at the time of the test operation, supplying a sixth signal from the voltage supply circuit to a gate of the fourth transistor.

18. The method according to claim 17, wherein
the voltage supply circuit further includes a sixth terminal and a second voltage output circuit that is electrically connected between the sixth terminal and the selection circuit, and said method further comprises:
at the time of the test operation, generating with the second voltage output circuit, the sixth signal using a second voltage applied to the sixth terminal; and
supplying the sixth signal to at least one of the gate of the third transistor and the gate of the fourth transistor.

19. The method according to claim 14, further comprising:
generating an offset voltage; and
adjusting either the first signal or the second signal at the time of the read operation using the offset voltage.

20. The method according to claim 14, wherein the memory cell is a magnetoresistive effect element comprising two magnetic layers, one of which has a variable magnetization direction and the other of which has a fixed magnetization direction, and a non-magnetic layer between the two magnetic layers.

* * * * *